United States Patent
Eitan et al.

(10) Patent No.: US 7,804,126 B2
(45) Date of Patent: Sep. 28, 2010

(54) DENSE NON-VOLATILE MEMORY ARRAY AND METHOD OF FABRICATION

(75) Inventors: Boaz Eitan, Ra'anana (IL); Ilan Bloom, Haifa (IL); Rustom Irani, Santa Clara, CA (US)

(73) Assignee: Saifun Semiconductors Ltd., Netariya (IL)

( * ) Notice: Subject to any disclaimer, the term of this patent is extended or adjusted under 35 U.S.C. 154(b) by 818 days.

(21) Appl. No.: 11/489,237

(22) Filed: Jul. 18, 2006

(65) Prior Publication Data

US 2007/0048940 A1 Mar. 1, 2007

Related U.S. Application Data

(60) Provisional application No. 60/699,857, filed on Jul. 18, 2005, provisional application No. 60/739,426, filed on Nov. 25, 2005, provisional application No. 60/800,022, filed on May 15, 2006.

(51) Int. Cl.
*H01L 29/792* (2006.01)
(52) U.S. Cl. .................. 257/324; 257/E29.309
(58) Field of Classification Search ................ 257/314, 257/324, E29.309
See application file for complete search history.

(56) References Cited

U.S. PATENT DOCUMENTS

| | | | |
|---|---|---|---|
| 5,236,853 A | 8/1993 | Hsue | |
| 5,310,693 A | 5/1994 | Hsue | |
| 5,328,810 A | 7/1994 | Lowrey et al. | |
| 5,789,776 A * | 8/1998 | Lancaster et al. | 257/296 |
| 5,795,830 A | 8/1998 | Cronin et al. | |
| 6,232,632 B1 | 5/2001 | Liu | |
| 6,468,861 B2 | 10/2002 | Iijima | |
| 6,649,972 B2 | 11/2003 | Eitan | |
| 6,689,660 B1 | 2/2004 | Noble et al. | |
| 7,105,099 B2 | 9/2006 | Chung et al. | |
| 7,115,525 B2 | 10/2006 | Abatchev et al. | |
| 7,177,227 B2 | 2/2007 | Petti et al. | |
| 7,238,974 B2 * | 7/2007 | Strassburg et al. | 257/208 |
| 2004/0214379 A1 | 10/2004 | Lee et al. | |
| 2005/0068806 A1 | 3/2005 | Hurst et al. | |
| 2005/0201154 A1 | 9/2005 | Yuan et al. | |
| 2006/0084219 A1 | 4/2006 | Lusky et al. | |
| 2006/0211188 A1 | 9/2006 | Lusky et al. | |
| 2006/0216923 A1 | 9/2006 | Tran et al. | |

(Continued)

FOREIGN PATENT DOCUMENTS

WO   WO99/49516   9/1999

(Continued)

OTHER PUBLICATIONS

Benschop, Joe; 32nm: Lithography at a Crossroad, Jun. 26, 2006 Published by ASML Netherlands B.V., De Run 6501, 5504 DR Veldhoven, The Netherlands.

*Primary Examiner*—Mark Prenty
(74) *Attorney, Agent, or Firm*—Eitan Mehulal Law Group

(57) ABSTRACT

A non-volatile memory array has word lines spaced a sub-F (sub-minimum feature size F) width apart and bit lines generally perpendicular to the word lines. The present invention also includes a method for word-line patterning of a non-volatile memory array which includes generating sub-F word lines from mask generated elements with widths of at least a minimum feature size F.

6 Claims, 35 Drawing Sheets

U.S. PATENT DOCUMENTS

2006/0281266 A1    12/2006    Wells
2007/0048940 A1 *   3/2007    Eitan et al. .................. 438/257

FOREIGN PATENT DOCUMENTS

| WO | WO00/54335    | 9/2000  |
| WO | WO03/032393   | 4/2003  |
| WO | WO2004/107435 | 12/2004 |

* cited by examiner

DENSE NON-VOLATILE MEMORY ARRAY AND METHOD OF FABRICATION

CROSS-REFERENCE TO RELATED APPLICATIONS

This application claims benefit from U.S. Provisional Patent Application No. 60/699,857, filed Jul. 18, 2005, from U.S. Provisional Patent Application No. 60/739,426, filed Nov. 25, 2005, and from U.S. Provisional Patent Application No. 60/800,022, filed May 15, 2006, all of which are hereby incorporated in their entirety by reference.

FIELD OF THE INVENTION

The present invention relates to non-volatile memory cells generally and to a method of fabrication thereof in particular.

BACKGROUND OF THE INVENTION

Dual bit memory cells are known in the art. One such memory cell is the NROM (nitride read only memory) cell 10, shown in FIG. 1 to which reference is now made, which stores two bits 12 and 14 in a nitride based layer 16, such as an oxide-nitride-oxide (ONO) stack, sandwiched between a polysilicon word line 18 and a channel 20. Channel 20 is defined by buried bit line diffusions 22 on each side which are isolated from word line 18 by a thermally grown oxide layer 26, grown after bit lines 22 are implanted. During oxide growth, bit lines 22 may diffuse sideways, expanding from the implantation area.

NROM cells are described in many patents, for example in U.S. Pat. No. 6,649,972, assigned to the common assignees of the present invention, whose disclosure is incorporated herein. Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NROM and related technologies may be found at "Non Volatile Memory Technology", 2005 published by Saifun Semiconductor and materials presented at and through http://siliconnexus.com, "Design Considerations in Scaled SONOS Nonvolatile Memory Devices" found at:
http://klabs.org/richcontent/MemoryContent/nvmt_symp/nvmts_2000/presentations/b u_white_sonos_lehigh_univ.pdf, "SONOS Nonvolatile Semiconductor Memories for Space and Military Applications" found at:
http://klabs.org/richcontent/MemoryContent/nvmt_symp/nvmts_2000/papers/adams_d.pdf, "Philips Research—Technologies—Embedded Nonvolatile Memories" found at: http://research.philips.com/technologies/ics/nvmemories/index.html, and "Semiconductor Memory: Non-Volatile Memory (NVM)" found at: http://ece.nus.edu.sg/stfpage/elezhucx/myweb/NVM.pdf, all of which are incorporated by reference herein in their entirety.

As shown in FIG. 2, to which reference is now briefly made, NROM technology employs a virtual-ground array architecture with a dense crisscrossing of word lines 18 and bit lines 22. Word lines 18 and bit lines 22 optimally can allow a 4 $F^2$ size cell, where F designates the minimum feature size of an element of the chip for the technology in which the array was constructed. For example, the feature size for a 65 nm technology is F=65 nm.

For NROM cells, the minimum length of a cell is 2 F, being the minimum length (1 F) of a bit line 22 plus the minimum length (1 F) of a spacing 23 between bit lines 22. The minimum width of a cell is also 2 F, being the minimum width (1 F) of a word line 18 plus the minimum width (1 F) of a spacing 19 between word lines 18. Thus, the theoretical minimum area of a cell is 4 $F^2$.

It should be noted, that it is possible to create bit lines 22 of less than 1 F, but in such cases the length of associated spacing 23 must be increased by a corresponding amount, such that the total length of a bit line 22 and an associated spacing 23 must be at least 2 F. Similarly, it is possible to create word lines 18 of less than 1 F, but in such cases the width of associated spacing 19 must be increased by a corresponding amount, such that the total width of a word line 18 and an associated spacing 19 must be at least 2 F.

Unfortunately, most NROM technologies which use the more advanced processes of less than 170 nm (where F=0.17 μm) employ a larger cell, of 5-6 $F^2$, due to the side diffusion of the bit lines which required a bit line spacing of about 1.6 F.

There exists a dual polysilicon process (DPP) for the NROM cell, where a first polysilicon layer is deposited and etched in columns between which bit lines 22 are implanted. Word lines 18 are then deposited as a second polysilicon layer, cutting the columns of the first polysilicon layer into islands between bit lines 22. Before creating the second polysilicon layer, bit line oxides are deposited between the first polysilicon columns, rather than grown as previously done. The result are bit line oxides that remain within the feature size of the polysilicon columns. In some DPP processes, spacers are created on the sides of the first polysilicon columns, which reduces the space for the bit lines. This enables the bit lines to be thinner than 1 F. For example, bit lines 22 might be 0.7 F while the columns between them might be 1.6 F. This produces a width of 2.3 F and a resultant cell area of 4.6 $F^2$, which is closer to the theoretical minimum of 4 $F^2$ than for prior processes, but still not there. Approaching the theoretical minimum is important as there is a constant push in industry to put more features into the same real estate.

SUMMARY OF THE PRESENT INVENTION

An object of the present invention is to, at least, increase the density of memory arrays.

There is therefore provided, in accordance with a preferred embodiment of the present invention, a non-volatile memory array with word lines spaced a sub-F (sub-minimum feature size F) width apart and bit lines generally perpendicular to the word lines.

Further in accordance with a preferred embodiment of the present invention, the word lines are a sub-F width.

Still further, in accordance with a preferred embodiment of the present invention, the array is a NROM (nitride read only memory) array.

Additionally, in accordance with a preferred embodiment of the present invention, the sub-F spacing is filled with dielectric.

Moreover, in accordance with a preferred embodiment of the present invention, the sub-F word line width is at least 0.5 F and the sub-F spacing is less than 0.5 F.

Further, in accordance with a preferred embodiment of the present invention, the dielectric is oxide-nitride-oxide.

Still further, in accordance with an alternative preferred embodiment of the present invention, the sub-F word line width is at least 0.1 F and the sub-F spacing is at least 0.7 F.

Moreover, in accordance with a preferred embodiment of the present invention, the word lines are formed from polysilicon spacers.

Additionally, there is provided, in accordance with a preferred embodiment of the present invention, a method for word-line patterning of a non-volatile memory array includes generating sub-F word lines from mask generated elements with widths of at least a minimum feature size F.

Further, in accordance with a preferred embodiment of the present invention, the generating includes generating a first set of rows from the mask generated elements, and then generating a second set of rows, interleaved between the first set of rows, from the first set of rows.

Still further, in accordance with a preferred embodiment of the present invention, the method also includes etching polysilicon columns, which are generally perpendicular to the rows, self-aligned to the first and second sets of rows, to generate word line gates and filling spaces between the rows and the word line gates with insulating material.

Moreover, in accordance with a preferred embodiment of the present invention, the first and second steps of generating generate sub-F width rows.

Additionally, in accordance with a preferred embodiment of the present invention, the rows are formed of polysilicon or metal.

There is also provided, in accordance with a preferred embodiment of the present invention, a method for word-line patterning of a non-volatile memory array. The method includes: having polysilicon columns covering active areas of the array; creating an extended mask for a first set of rows from a mask having rows with widths of at least the minimum feature size F, the extended mask having sub-F openings between the rows; filling the sub-F openings with polysilicon to create the first set of rows above the polysilicon columns; removing the extended mask; adding extensions to the first set of rows to generate a second set of sub-F openings between those rows; filling the second set of sub-F openings with polysilicon to create a second set of rows; capping the first and second sets of rows; removing the extensions; etching the polysilicon columns using the capped rows as a mask to generate word line gates; and filling spaces between the rows and the word line gates with insulating material.

Further, in accordance with a preferred embodiment of the present invention, the rows are formed of metal, which may tungsten or cobalt.

There is also provided, in accordance with a preferred embodiment of the present invention, a non-volatile memory array including a plurality of polysilicon gates, one per memory cell, metal word lines each connecting a row of the gates and bit lines generally perpendicular to the word lines.

Further, in accordance with a preferred embodiment of the present invention, the gates are self-aligned to the word lines and to the bit lines.

Moreover, in accordance with a preferred embodiment of the present invention, the metal word lines are formed with a dual damascene process.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
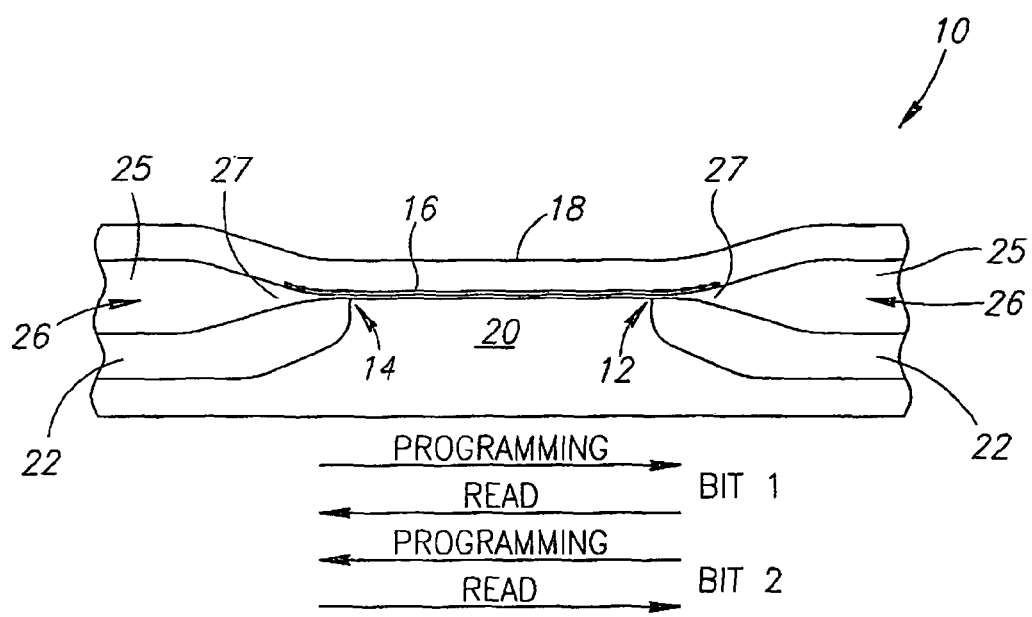
FIG. 1 is a schematic illustration of an NROM memory cell.
Figure 2:
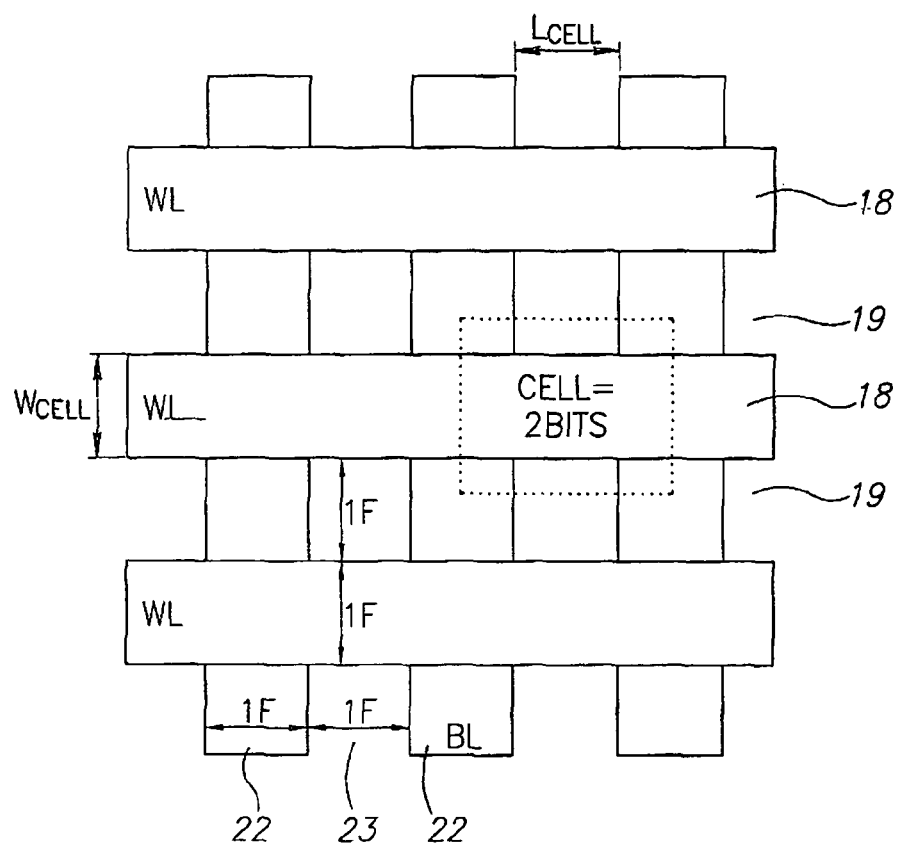
FIG. 2 is a schematic illustration of a layout of the cell of FIG. 1.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention may provide an increased number of bits per given area over the prior art. In general, increasing the density of the cells increases the number of bits in a given area. One way to increase the density is to reduce the length of the cells. Another method to increase density is to utilize the space between word lines to insert more word lines. In an ideal situation, the cell size may be reduced by half by having 2 word lines in an opening of 2 F (resulting in 1 word line in a 1 F pitch). Such a "double density" array may store twice as much data.

Applicants have realized that such a double density array generates cells significantly smaller than the 4 $F^2$ minimum size of the prior art. It further reduces the pitch between word lines to less than the 2 F minimum of the prior art.

Applicants have realized that there may be more than one way to create such a double density array. The present application may therefore comprise more than one preferred embodiment for such creation.

In the first such preferred embodiment, shown in FIGS. 3-10D, a self aligning process may be used to generate sub-1 F word lines from an initial mask generated by a standard lithographic process. Word line spacings may also be sub-1 F and may be filled with a dielectric.

In an alternative preferred embodiment, discussed with respect to FIGS. 11A-26B, sub-1 F word lines may be generated using spacer technology.

Self-Aligning Embodiment

Figure 3:
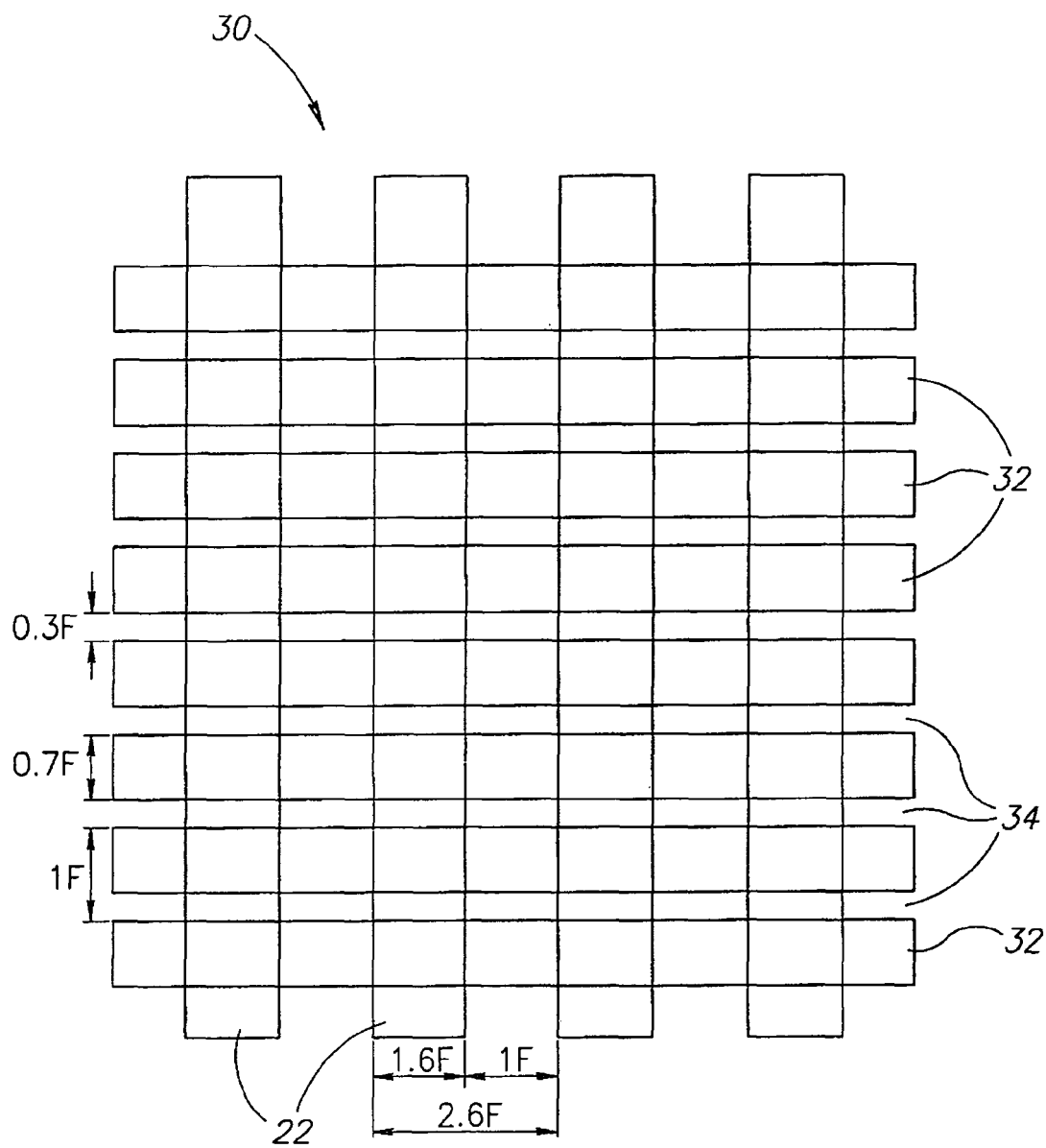
FIG. 3 is a schematic illustration of a layout of an array, constructed and operative in accordance with a preferred embodiment of the present invention.

Reference is now made to FIG. 3, which illustrates a novel, dense array 30, constructed and operative in accordance with the first preferred embodiment of the present invention. Array 30 may reduce the minimum size of a memory cell, by providing sub-minimum-feature-size, "sub-F", word lines 32 and word line spacings 34 (resulting in a word line width that is less than 1 F and a spacing that is less than 1 F). For example, in FIG. 3, word line spacings 34 are shown as an exemplary 0.3 F. Because word line spacings 34 may be so narrow, they may be filled with a dielectric, such as ONO, nitride or oxide.

Word lines 32 may also be thin (of sub-F width). In FIG. 3, the width of word lines 32 is shown as 0.7 F. It will be appreciated that the widths of word lines 32 and spacings 34 in FIG. 3 are exemplary; other sub-F widths are possible and are included in the present invention. For example, for a 1 F pitch (which includes the word line width together with the spacing), spacings 34 may be 0.4 F wide and word lines 32 might be 0.6 F wide. For a 1.2 F pitch, spacings 34 might be 0.4 F and word lines 32 might be 0.8 F. Alternatively, spacings 34 might be 0.3 F wide and word lines 32 might be 0.9 F wide. It will be appreciated that, in all of the above examples, there is a substantial reduction of the word line spacing and a smaller reduction of the word line width.

It will also be appreciated that, in the present invention, the widths of word lines 32 and spacings 34 are not required to be the same. In FIG. 3, word lines 32 are wider than word line spacings 34. However, the pitch for word lines 32 may be 1 F and the minimum spacing between word lines may be electrically limited to the point at which the dielectric between word lines 32 breaks down.

For example, oxide breakdown is 9-11 MV/cm, which, for a 10V voltage drop between word lines during programming or erasing, may occur with a dielectric thickness of about 10 nm. Thus, for this type of dielectric, a minimal width for word line spacing 34 may be 10 nm. For reliability and quality purposes, such a minimal word line spacing may be increased to 15 nm.

Assuming a pitch of 2.6 F between bit lines 22, as is possible for dual polysilicon process (DPP) type memory cells and as shown in FIG. 3, the cell size of the example in FIG. 3 may be 2.6 F×1 F=2.6 $F^2$, a considerably smaller size than in the prior art. It will be appreciated that the minimum cell size for the present invention is 2 F×1 F=2 $F^2$.

It will be appreciated that the present invention may also be implemented in non-DPP type memory cells, and also for non-NROM type memory cells. Furthermore, the memory cells may store 2 bits or 4 bits, with no change in the basic physics and operating mode of the cell.

In accordance with a preferred embodiment of the present invention and as will be shown hereinbelow, sub-F elements may be generated from elements which are the minimum feature size F or larger. As will be described hereinbelow, the present invention utilizes common lithographic concepts to generate such small features.

Figure 4A:
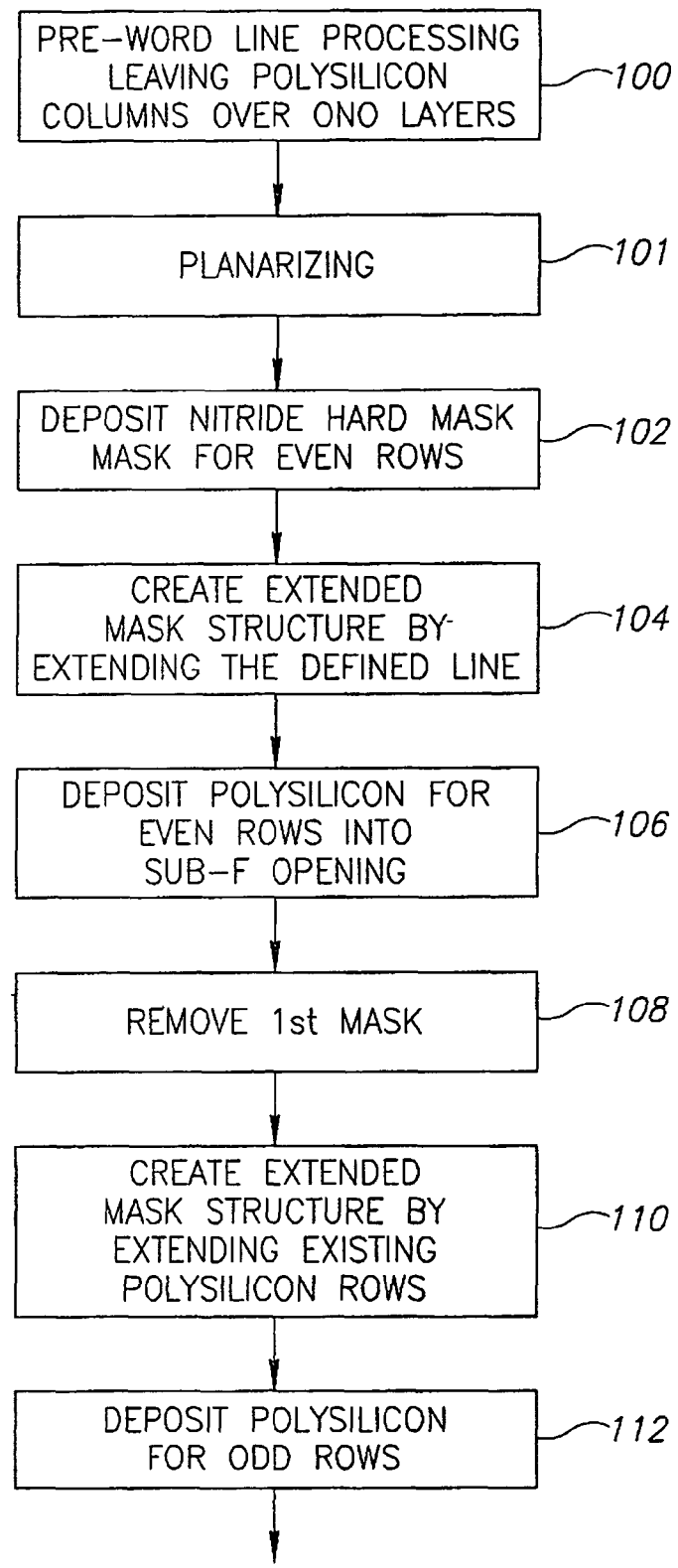
FIGS. 4A and 4B are flow chart illustrations of a word-line patterning method for creating the array of FIG. 3, constructed and operative in accordance with a preferred embodiment of the present invention.
Figure 4B:
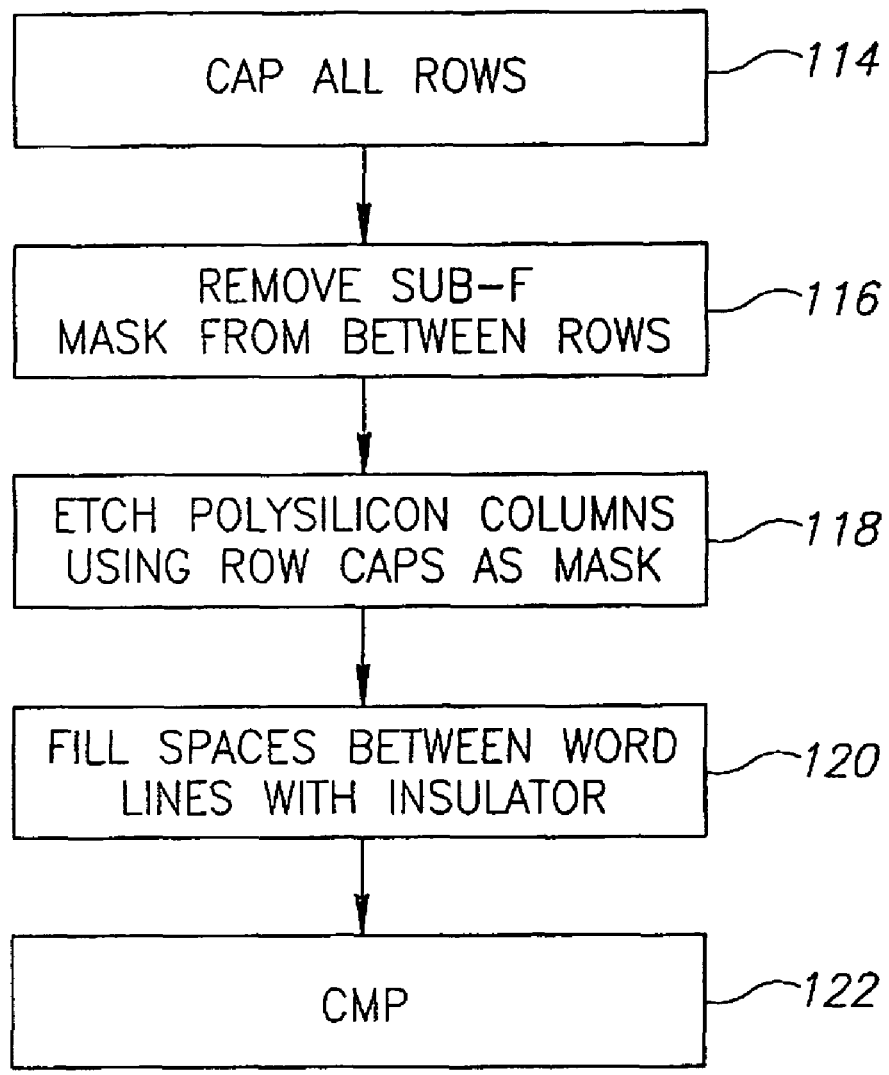

Reference is now made to FIGS. 4A and 4B, which illustrate the process and to FIGS. 5A and 5B and 6A-6M, which illustrate various steps within the process of FIGS. 4A and 4B.

The process begins, in step 100, with the process steps prior to word line patterning. The process steps may be any suitable set of steps, an exemplary set of which are described hereinbelow with respect to FIG. 7. Other suitable DPP type process steps may be found in the following applications assigned to the common assignees of the present invention, which applications are incorporated herein by reference: U.S. patent application Ser. No. 11/247,733 filed Oct. 11, 2005, U.S. patent application Ser. No. 11/336,093 filed Jan. 20, 2006 and U.S. patent application Ser. No. 11/440,624, filed May 24, 2006.

Figure 5A:
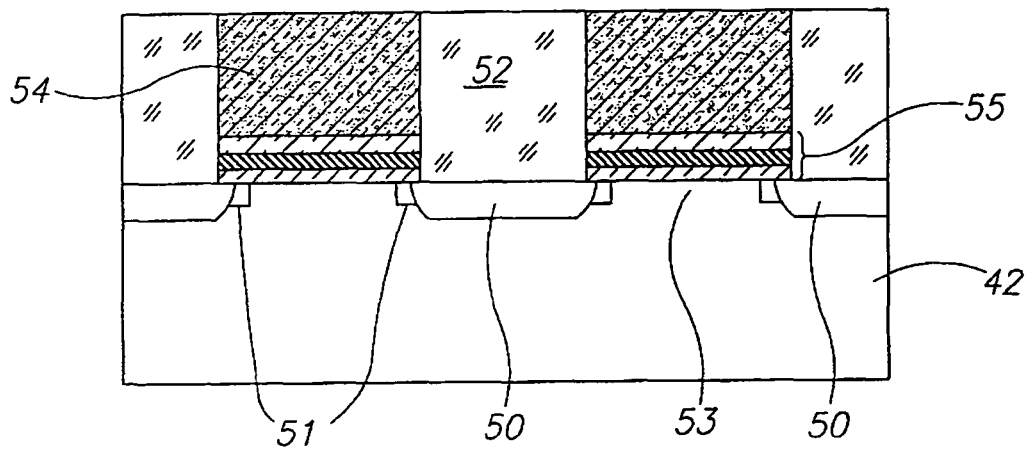
FIGS. 5A, 5B, 6A, 6B, 6C, 6D, 6E, 6F, 6G, 6H, 6I, 6J, 6K, 6L and 6M are schematic illustrations of various steps within the process of FIGS. 4A and 4B.

An exemplary cross-section of the memory array is shown in FIG. 5A. Columns of bit lines 50 and pocket implants 51 may be implanted into a substrate 42. Above bit lines 50 may be squared bit line oxides 52. Channels 53 may be formed between bit lines 50 and columns of ONO elements 55 may be formed above channels 53 and between bit line oxides 52. Columns 54 of polysilicon, of a first polysilicon layer, may be formed above ONO elements 55 and may protect ONO elements 55 during the word line patterning described hereinbelow. Columns 54 may be formed of polysilicon or, alternatively, of polysilicon with oxide or nitride spacers (or a combination thereof) on their sides.

In accordance with a preferred embodiment of the present invention, the memory array may be planarized (step 101) prior to beginning word line patterning. An exemplary planarizing operation may be chemical-mechanical polishing (CMP). Thus, columns 54 of polysilicon and columns 52 of bit line oxides may, together, provide a flat surface for word line patterning. In one embodiment, polysilicon columns 54 may be deposited to 60 nm and may be planarized down to 55 nm; however, in alternative embodiments, polysilicon columns may have an initial thickness of 30-100 nm.

With polysilicon columns 54 protecting ONO elements 55, the word line patterning may begin. In accordance with a preferred embodiment of the present invention, the word lines may be generated as rows first, perpendicular to polysilicon columns 54, which may be separated into two interleaved types. For ease of discussion, the rows will be called here "even" rows and "odd" rows. The present discussion will show the creation of the even rows first, it being appreciated that the odd rows may be created first just as easily. Once both sets of rows are generated, the word lines may be created therefrom. It will be appreciated that, since the two sets of rows are not created at the same time, they may have slightly different widths.

Figure 5B:
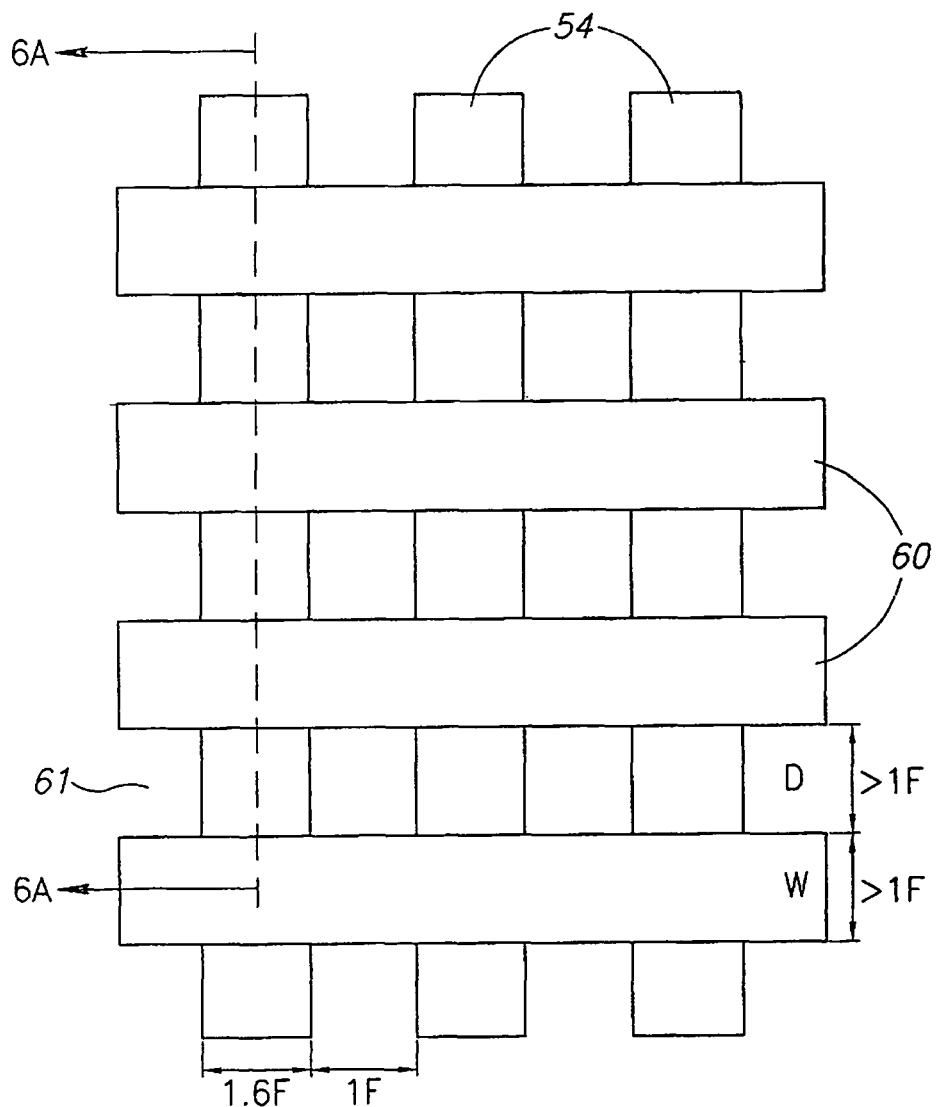

To create the even rows, a first mask, such as a nitride hard mask, may be deposited (step 102) on the array and may be patterned into rows 60. FIG. 5B is a plan view of the array, showing polysilicon columns 54 and rows 60 of the first mask. As can be seen, polysilicon columns 54 are of width 1.6 F and are separated by a distance of 1 F while rows 60 may be of a mask width W of 1 F or more and may be separated from its neighbor by a spacing D of 1 F or larger, defining openings 61. For the example described hereinbelow, for a 63 nm technology, mask width W is 75 nm (which is larger than the minimum feature size of 63 nm) and spacing D is 75 nm. Alternatively, mask width W might be 100 nm and spacing D might also be 100 nm. In another embodiment, mask width W might be 63 nm and spacing D might be 63 nm. In general, mask width W and spacing D are the same but this is not required.

Figure 6A:
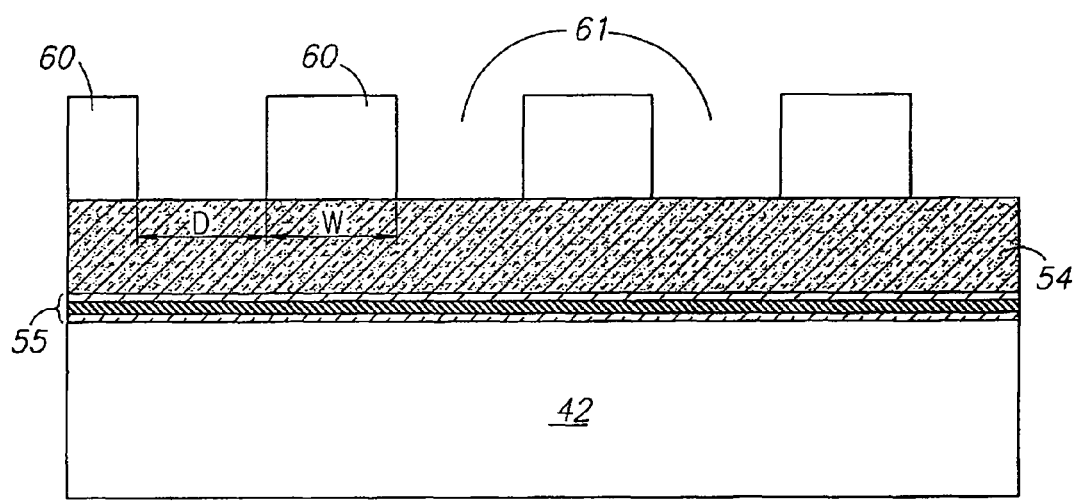

FIG. 6A is a cross-sectional view along one polysilicon column 54 of FIG. 5B. Thus, it shows polysilicon column 54 atop ONO layer 55 on top of substrate 42. Moreover, it shows even mask rows 60, in cross-section, above polysilicon column 54.

Figure 6B:
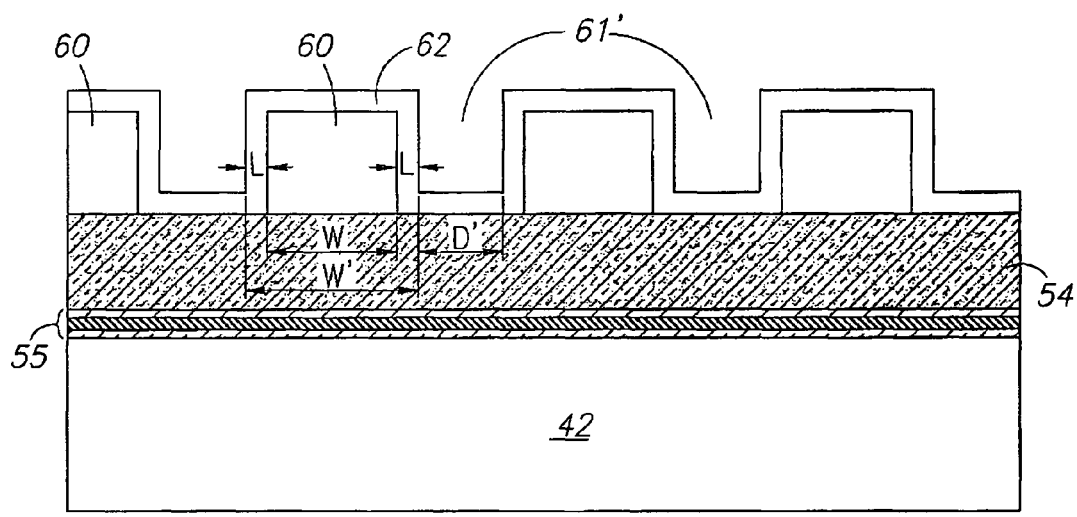
Figure 6C:
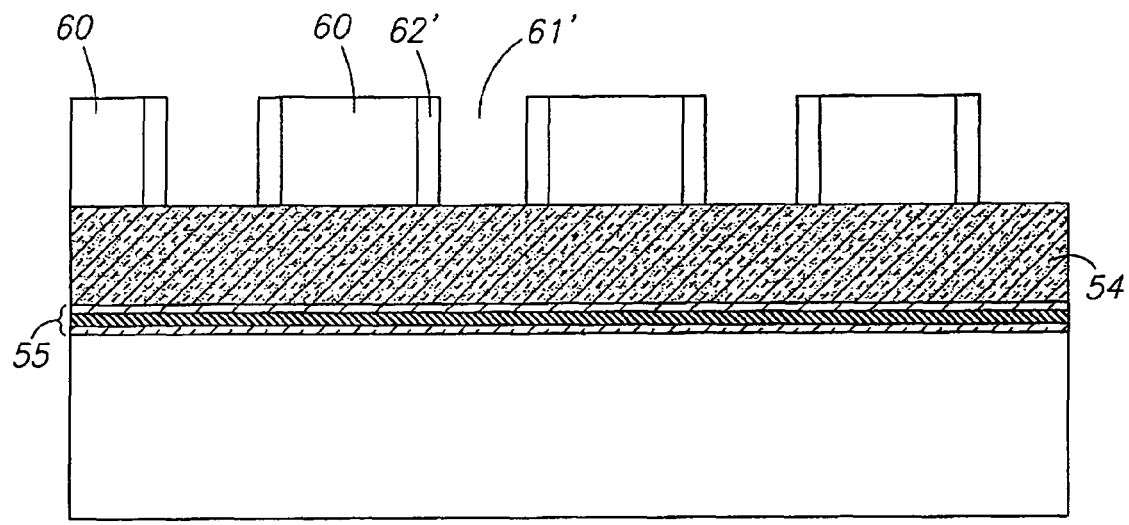
Figure 6D:
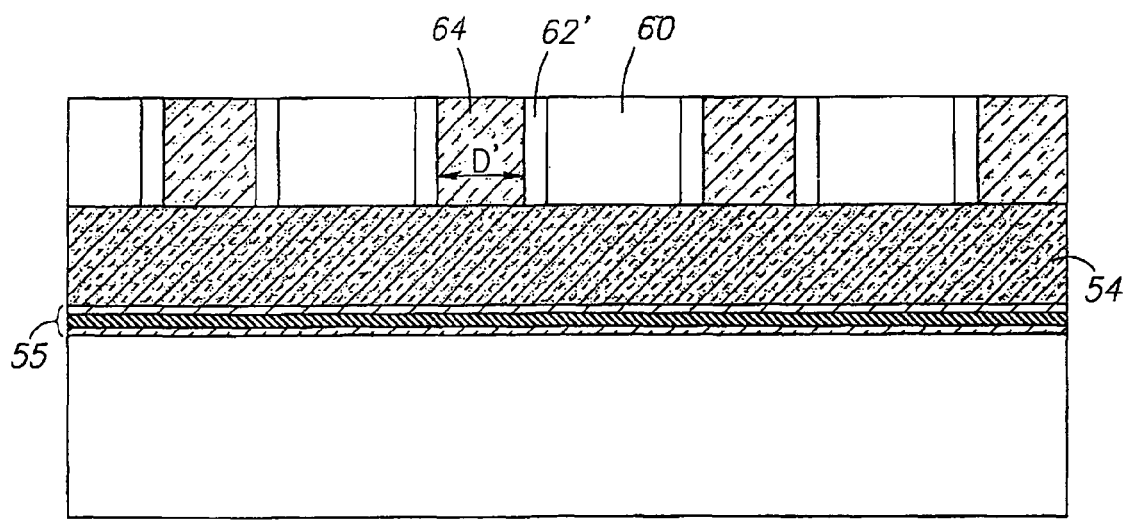
Figure 6E:
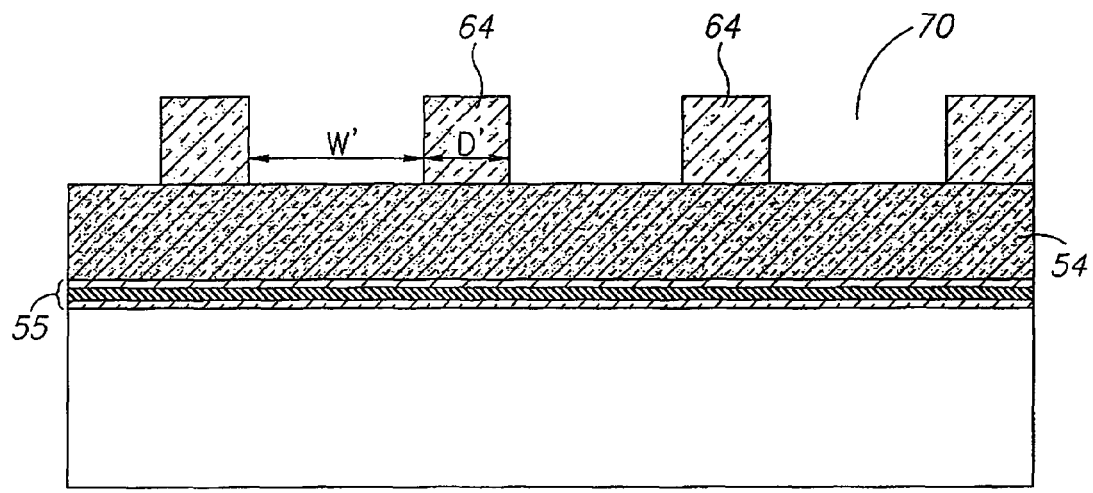

In step 104, an extended mask structure may be generated by extending mask width W of rows 60. For example, as shown in FIG. 6B, a liner 62, of width L, may first be deposited over rows 60 and, as shown in FIG. 6C, may then be etched back to generate spacers 62'. If the first mask is of nitride, then liner 62 (and the subsequent spacers 62') may also be of nitride. The spacer etch may be such to make spacers 62' with vertical sides and a planarization step may be performed later to make them flat. FIG. 6D shows them steep and rectangular.

Spacers 62' reduce the size of opening 61, now labeled 61', by twice the width L of liner 62. Thus, reduced opening 61' may be of a sub-F width D'=D-2 L. Similarly, spacers 62' may increase the mask width W of rows 60 to W'=W+2 L.

For the 75/75 mask width, liner 62 may be of width L=12.5 nm, which generates sub-F opening 61' of spacing D'=50 nm and extended mask width W' of 100 nm. It will be appreciated that sub-F openings 61' are not only smaller than the mask width rows 60 but also smaller than the minimum feature size F of 63 nm.

In step 106, polysilicon 64 may be deposited on the array to create the even rows. The polysilicon may cover the array and may fill sub-F openings 61'. The resultant array may be planarized, such as by a CMP process, to remove polysilicon 64 from everywhere but between spacers 62'. The CMP process may be continued to flatten spacers 62' as well. The CMP process may remove polysilicon 64 from the periphery as well.

It will be appreciated that the resultant polysilicon rows 64 are of width D', which is a sub-F width. In the 63 nm technology of FIG. 5, polysilicon rows 64 are a sub-F, 50 nm width.

With the even rows finished, the process may continue to the odd rows. Initially, the first mask may be removed (step 108). In the example, both rows 60 and spacers 62' are of nitride and thus, may be removed together with a nitride wet etch, leaving an extended opening 70 (shown in FIG. 6E) of width W'=W+2 L. In the present example, opening 70 may be of 100 nm. If the first mask is of a material other than nitride, then it may be removed with the appropriate etchant. The nitride (or other material) hard mask is also removed from the periphery during this step.

Figure 6F:
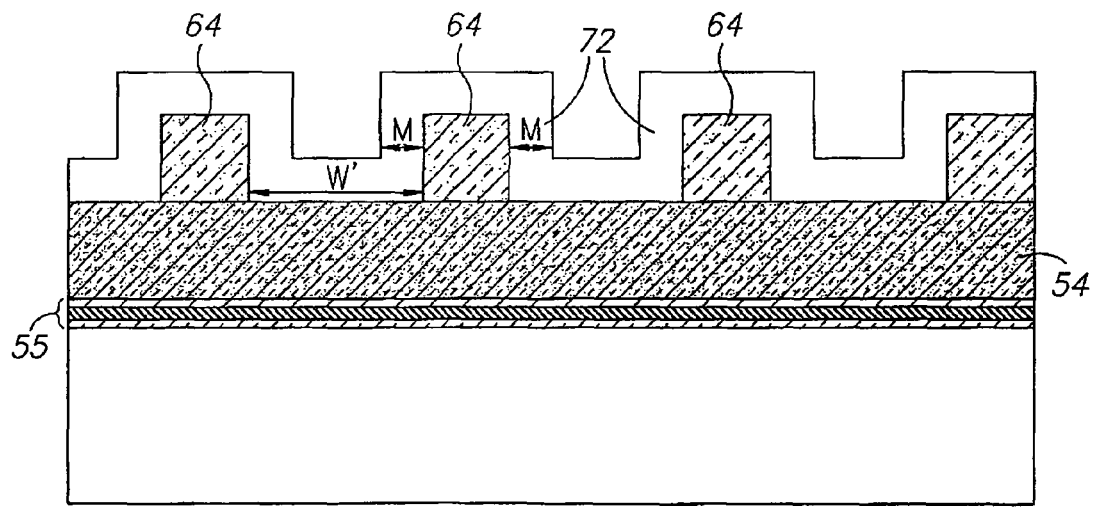
Figure 6G:
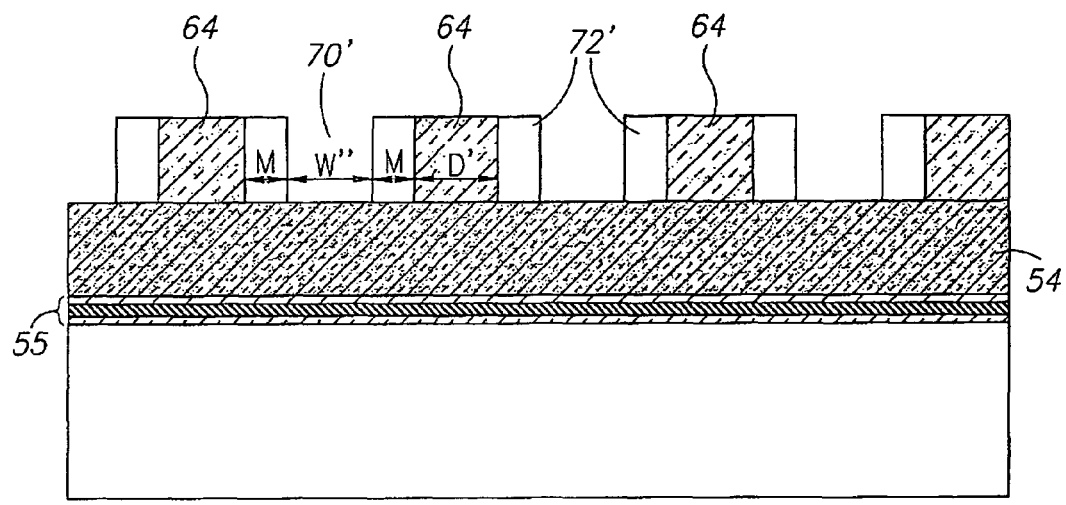

The openings for the odd rows may be generated (step 110) by creating another extended structure, this time from the existing even polysilicon rows 64. As shown in FIG. 6F, another liner, labeled 72, may be deposited on the array and may be etched back to a spacer 72' (FIG. 6G). Spacer 72' may be of nitride, as before, or of another material. For this mask, the spacer may be of sufficient width M to reduce extended opening 70 from extended width W' to a sub-F opening 70' whose width W''' may be generally equivalent to D', the width of even polysilicon rows 60. Typically, W'''=W'−2M. Moreover, second spacer width M may typically be twice first spacer width L. For the present example, width M of liner 72 may be 25 nm. If a vertical wall spacer is desired, it may be generated through multiple deposition and etch processes.

Figure 6H:
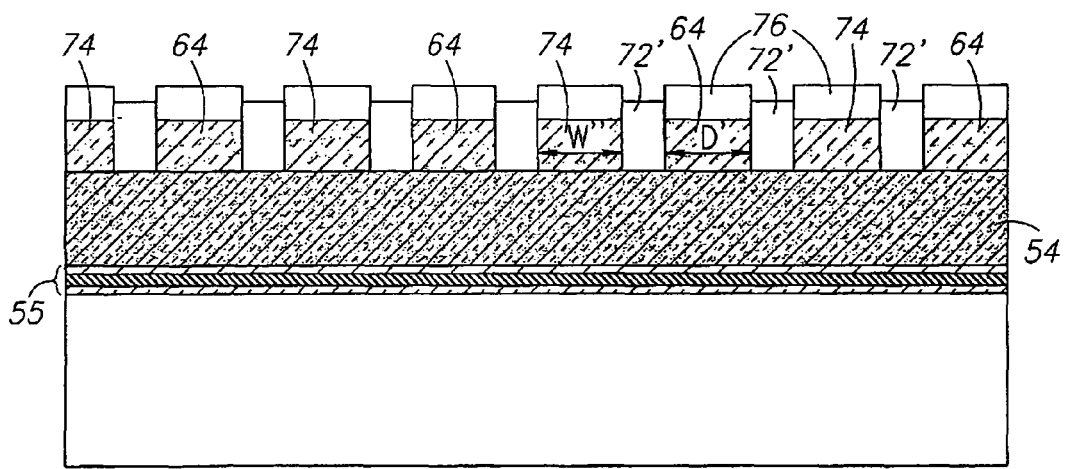
Figure 6I:
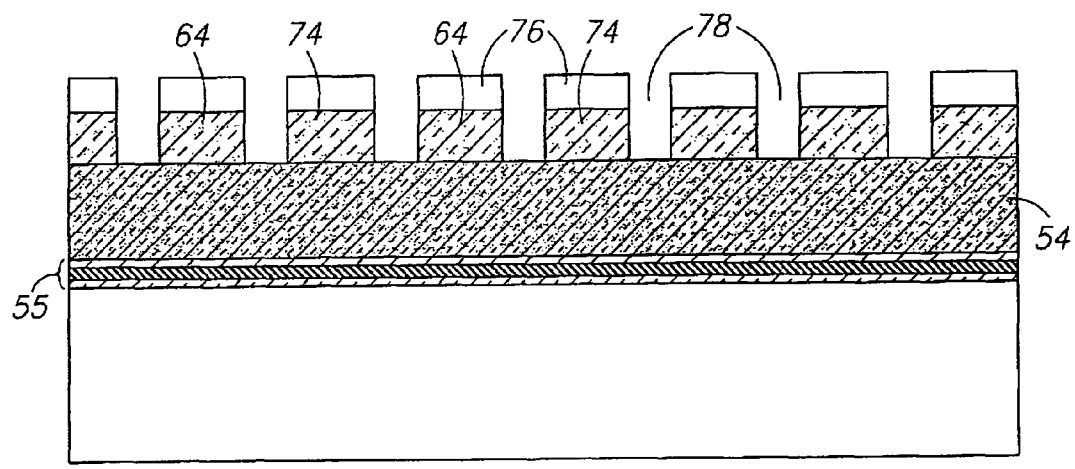

In step 112, polysilicon 74 may be deposited on the array to create the odd rows. As shown in FIG. 6H, polysilicon 74 may cover the array and may fill sub-F openings 70', resulting in alternating rows of polysilicon, even rows 64 alternating with odd rows 74. In the periphery, polysilicon layer 74 is on top of polysilicon layer 54, to form the polysilicon gates of the periphery transistors. The resultant array may be planarized, such as by a CMP process, to remove polysilicon 74 from everywhere in the array but between spacers 72'. The CMP process may consume and flatten some of spacers 72' as well.

It will be appreciated that, at this point, all of the rows (both even and odd) have been generated but the word lines have not been fully generated. In step 114, the rows may be capped with self-aligned oxide caps 76 (FIG. 6H) or some other etch resistant material. If an oxide cap is used, step 114 may be an oxidation step, for example, 20 nm of wet oxidation at 750° C., which may oxidize both polysilicon rows 64 and 74, as well as the polysilicon covering the periphery. Alternatively, polysilicon rows 64 and 74 may have metallized caps (created via a metallization step). For example, a self aligned Tungsten deposition process may be used or a silicidation of the polysilicon may be done to render it more resistant to etch. Once again, only polysilicon rows 64 and 74 and the polysilicon of the periphery will be metallized. As can be seen in FIG. 6H, caps 76 may combine with some of the polysilicon, thereby reducing the height of rows 64 and 74.

Caps 76 may now be utilized to define the word lines. First, the sub-F mask (spacers 72') may be removed (step 116) from between rows 64 and 74, leaving sub-F openings 78 (FIG. 6I) between rows 64 and 74. For nitride spacers, the removal process may be a nitride wet removal operation.

Figure 6J:
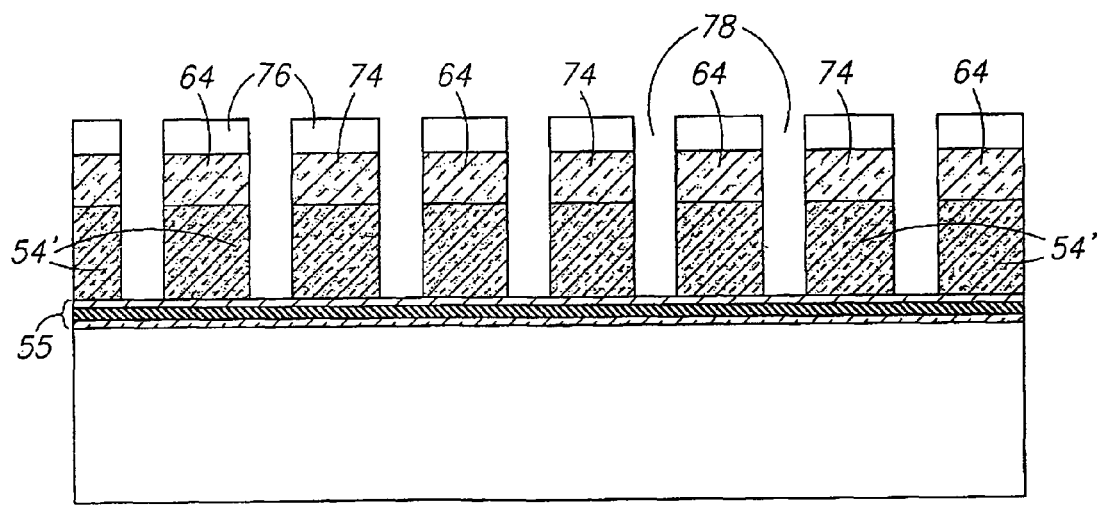

Next, polysilicon columns 54 may be etched (step 118) down to ONO layer 55, using caps 76 on each of polysilicon rows 64 and 74 as the hard mask. FIG. 6J shows one polysilicon column 54 of the previous figures etched into multiple islands, each marked 54'.

Figure 6K:
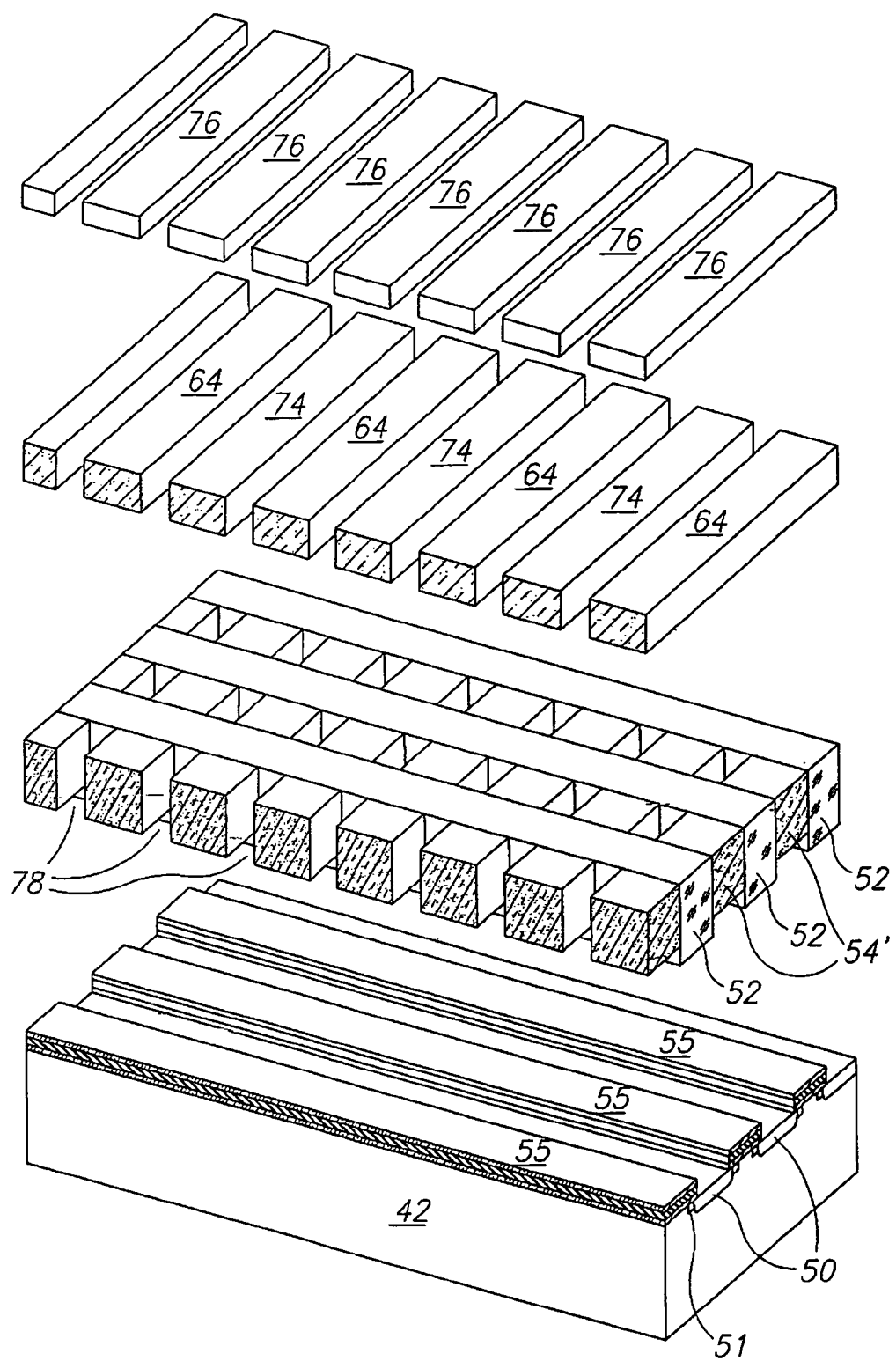

FIG. 6K, an expanded isometric view of FIG. 6J, shows the result of the polysilicon etch more clearly. The lowest layer is substrate 42 covered with three ONO columns 55 and the self-aligned bit lines 50 (with pocket implants 51) implanted into substrate 42. The second layer in FIG. 6K shows three bit line oxide columns 52 interlaced with what used to be three polysilicon columns 54 but are now etched into a multiplicity of polysilicon islands 54' which may form the gates of the cells. The fourth layer of FIG. 6K shows the alternating word line rows 64 and 74 and the top layer shows the rows of caps 76.

Figure 6L:
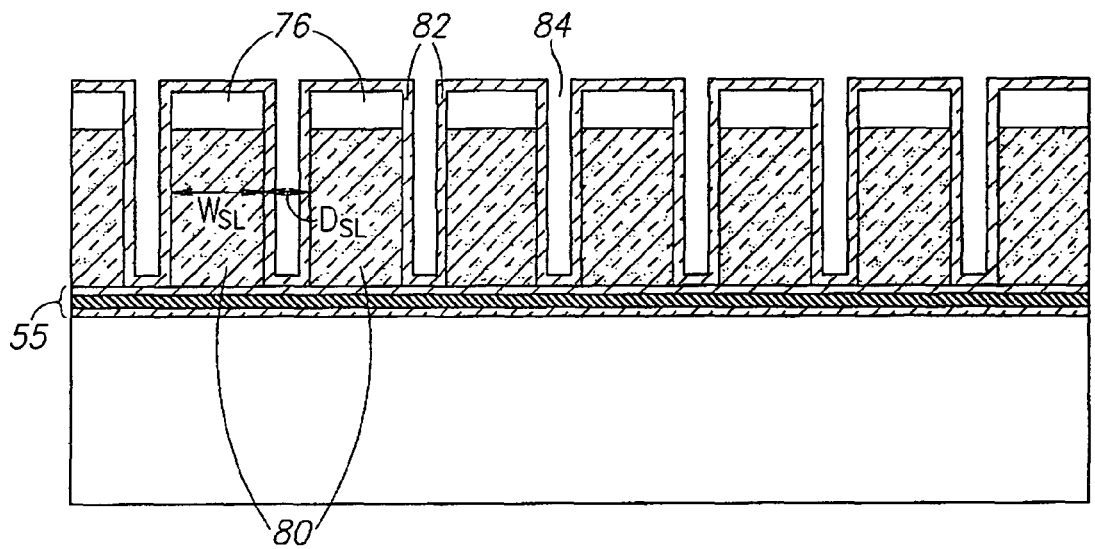
Figure 6M:
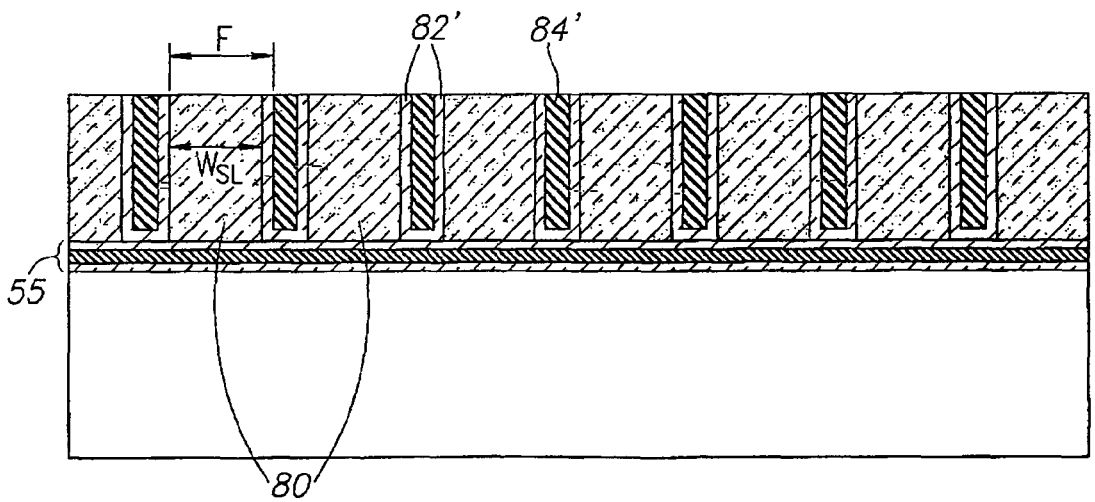

It will be appreciated that this polysilicon etching step is self-aligned, ensuring that the resultant word lines, labeled 80 in FIG. 6L, maintain the spacing defined by rows 64 and 74. It will further be appreciated that each word line 80 may be formed of one row 64 or 74 connecting gates 54' of first polysilicon. Finally, as can be seen from FIG. 6K, it will be appreciated that the polysilicon etch leaves bit line oxide columns 52 intact.

Returning to FIG. 6L, word lines 80 may have sub-F width $W_{sl}$ and may be separated by sub-F spacing $D_{sl}$, where $D_{sl}$=M and $W_{sl}$=W'''=D'''. In the present example, sub-F width $W_{sl}$ is 50 nm and sub-F spacing $D_{sl}$ is 25 nm. Moreover, word lines 80 may have a height which is the combined height of polysilicon gates 54' and of polysilicon rows 64 and 74. For example, they might be 85 nm thick.

With word lines 80 defined, openings 78 (FIG. 6I) there between may be filled (step 120) with an insulator. One insulator may be of oxide and may be generated by depositing oxide onto the array. Another one, shown in FIG. 6L, may be an ONO dielectric and may be generated by first depositing an oxide liner 82, such as of 6 nm, following by deposition, into the remaining opening, of a nitride liner 84 of 13 nm. The ONO filler may have a lower defect density than the oxide.

Furthermore, if there is a defect in the oxide portion of the ONO filler, the nitride may act to substantially reduce the leakage current between neighboring word lines.

Finally, the word line patterning may finish with a polishing step (step 122), such as a CMP step, which may remove the surface layers of liners 84 and 82 as well as caps 76. It may also remove some of polysilicon word lines 80. For example, the thickness of word lines 80 in the present example may be reduced to 80 nm. Alternatively, for metalized caps, the oxide or ONO may remain on top of the metal. The result for oxide caps, shown in FIG. 6M, may be a set of word lines 80 of sub-F width $W_{sl}$ separated by sub-F distances $D_{sl}$. It is noted that sub-F distances $D_{sl}$ may be less than half of feature size F while widths $W_{sl}$ may be greater than half of feature size F.

It will be appreciated that, since the even and odd word lines are not created in the same step, they may be of slightly different widths.

With the word lines generated, the manufacturing may continue as is known in the art.

It will be appreciated that the ratios discussed hereinabove are exemplary only. Any suitable sub-F word line width $W_{sl}$ and sub-F insulator width $D_{sl}$ between word lines may be created, from any original mask elements. For example, for the 63 nm technology, the following word line and insulator widths represent some of the elements which may be created from elements laid down by masks (listed as a width/space ratio):

| Lithography (W/D) (nm/nm) | Word line Width $W_{sl}$ (nm) | Insulator Spacing $D_{sl}$ (nm) | Word line pitch |
|---|---|---|---|
| 75/75 | 50 | 25 | 1.2 F |
| 75/75 | 40 | 35 | 1.2 F |
| 100/100 | 63 | 37 | 1.65 F |
| 63/63 | 40 | 23 | 1 F |

It will further be appreciated that the sub-F elements are generated from mask elements which are of minimum feature size F or larger. Moreover, the sub-F elements are all self-aligned—each one is generated from existing elements and not via lithography and thus, may scale with smaller lithographies.

It will further be appreciated that the method of the present invention may be utilized to generate feature-size word lines (of feature size F) with sub-F spacing. This can be done by starting with an appropriate starting pitch.

Figure 7:
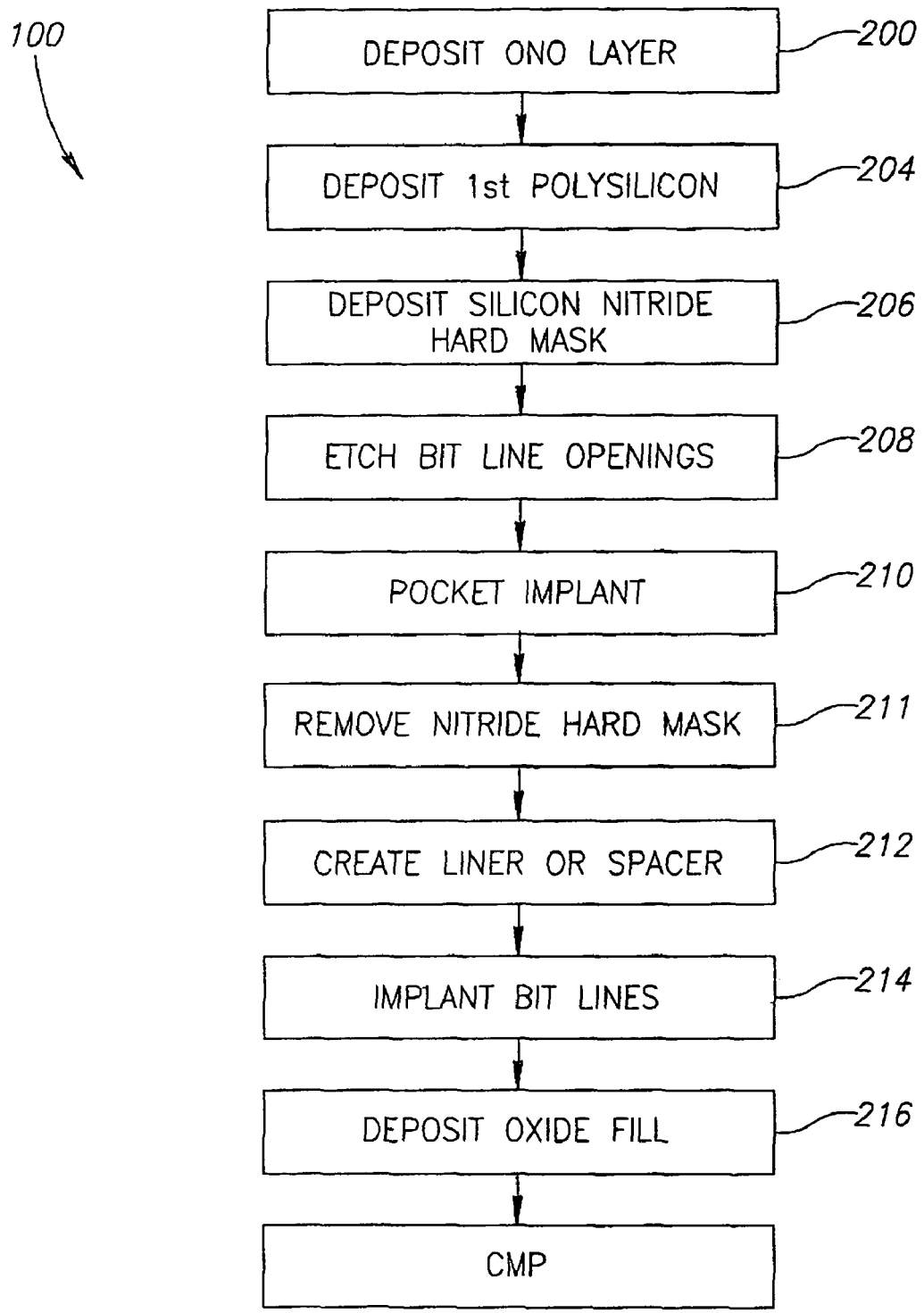
FIG. 7 is a flow chart illustration of a method for pre-word-line patterning, which is useful for the method of FIGS. 4A and 4B.
Figure 8A:
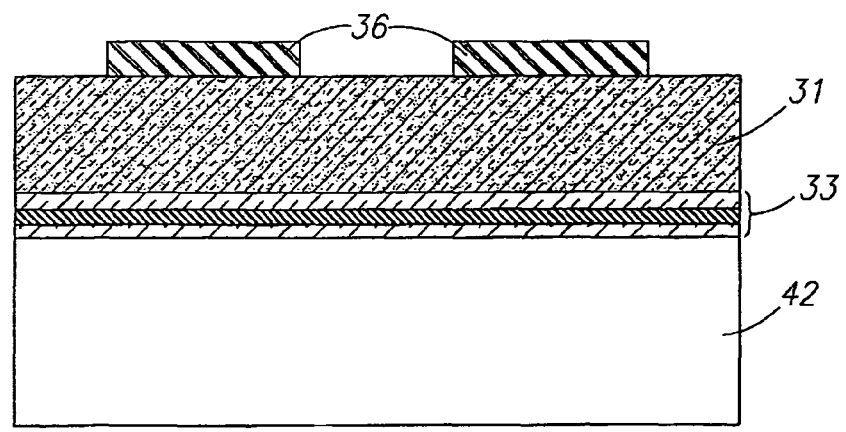
FIGS. 8A, 8B and 8C are schematic illustrations of various steps within the process of FIG. 7.
Figure 8B:
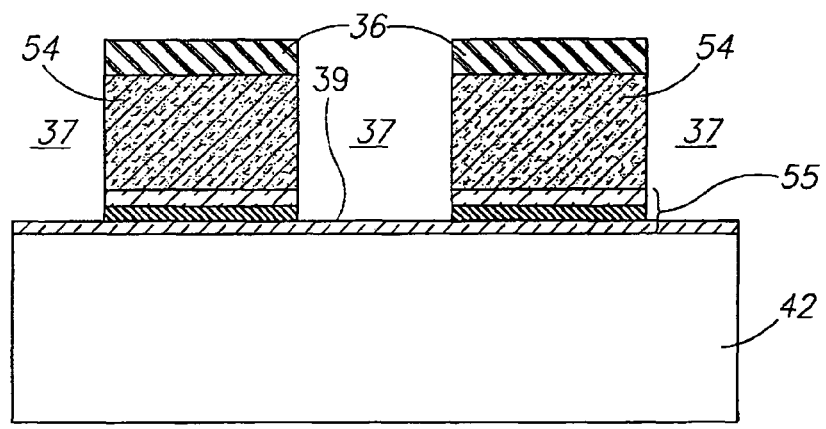
Figure 8C:
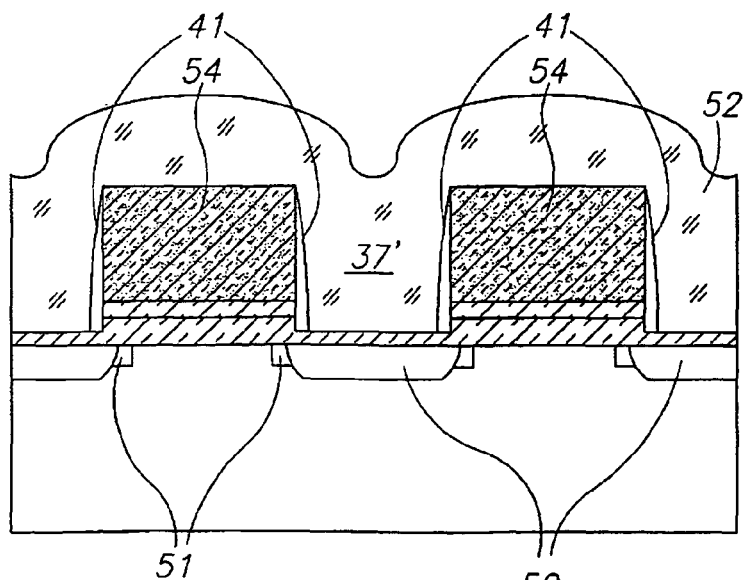

Reference is now made to FIG. 7, which illustrates an exemplary method for pre-word line patterning (step 100 of FIG. 4A). Reference is also made to FIGS. 8A, 8B and 8C which show the results of various steps of FIG. 7.

After preparation of substrate 42 (FIG. 8A), ONO layer 33 may be laid down (step 200) over the entire wafer, where, in an exemplary embodiment, the bottom oxide layer may be 2-5 nm thick, the nitride layer may be 5 nm thick and the gate oxide layer may be 12-14 nm thick.

In step 204, a first polysilicon layer 31 may be laid down over the entire chip. A nitride hard mask 36 may then be deposited (step 206) in a column pattern covering the areas of the memory array not destined to be bit lines. FIG. 8A shows the results of step 206. Two columns of nitride hard mask 36 are shown on top of polysilicon layer 31, which overlays ONO layer 33.

An etch may be performed (step 208) to generate bit line openings 37 by removing the areas of polysilicon layer and the oxide and nitride layers between columns of nitride hard mask layer 36. FIG. 8B shows the results of the etch process. Two columns 54 of first polysilicon and nitride hard mask 36 are shown on top of columns, now labeled 55, of ONO layer 33. The bottom oxide, labeled 39, is shown in bit line openings 37.

A pocket implant 51 (FIG. 8B), such as of Boron ($BF_2$), may now be implanted (step 210) next to or under polysilicon columns 54. An exemplary pocket implant may be of 1-3× $10^{13}/cm^2$ at an angle of 0-15°, where the angle may be limited by the width of bit line opening 37 and the height of polysilicon columns 54 covered by nitride hard mask 36. Part of pocket implant 51 may scatter and diffuse under polysilicon columns 54. In an alternative embodiment, the pocket implant may be of Boron or Indium.

In step 211, nitride hard mask 36 may be removed.

In step 212, spacers 41 may be generated on the sides of polysilicon columns 54. For example, spacers 41 may be generated by deposition of an oxide liner, such as of 12 nm, and an anisotropic etch, to create the spacer shape. Alternatively, the liner may be left as it is without forming a spacer.

Spacers 41 may decrease the width of bit line openings, labeled 37' in FIG. 8C, in order to reduce the width of the about-to-be implanted bit lines and to increase the effective length of the channels between bit lines.

Once spacers 41 have been formed, bit lines 50 may be implanted (step 214), followed by a rapid thermal anneal (RTA). In one exemplary embodiment, the bit line implant is of Arsenic of $2 \times 10^{15}/cm^2$ at 10-20 Kev and with an angle of 0 or 7% to the bit line.

In step 216, an oxide filler 52 may be deposited on the chip. As can be seen in FIG. 8C, oxide filler 52 may fill reduced bit line openings 37' and may cover other parts of the chip. In step 218, a CMP (chemical mechanical planarization) process may be performed to remove excess oxide filler 52. The result of step 218 may be seen in FIG. 5, discussed previously.

Figure 9A:
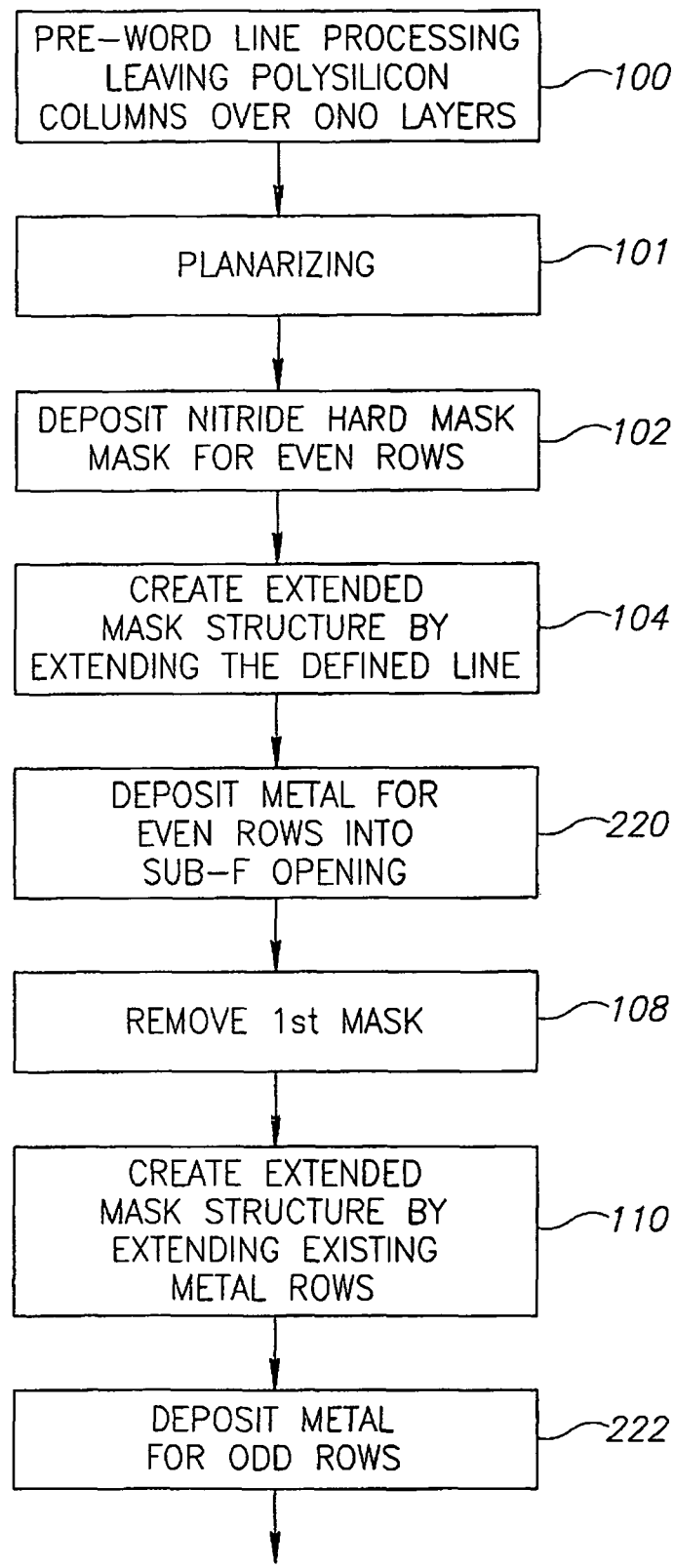
FIGS. 9A and 9B are flow chart illustrations of an alternative embodiment of the word line patterning method of FIGS. 4A and 4B.
Figure 9B:
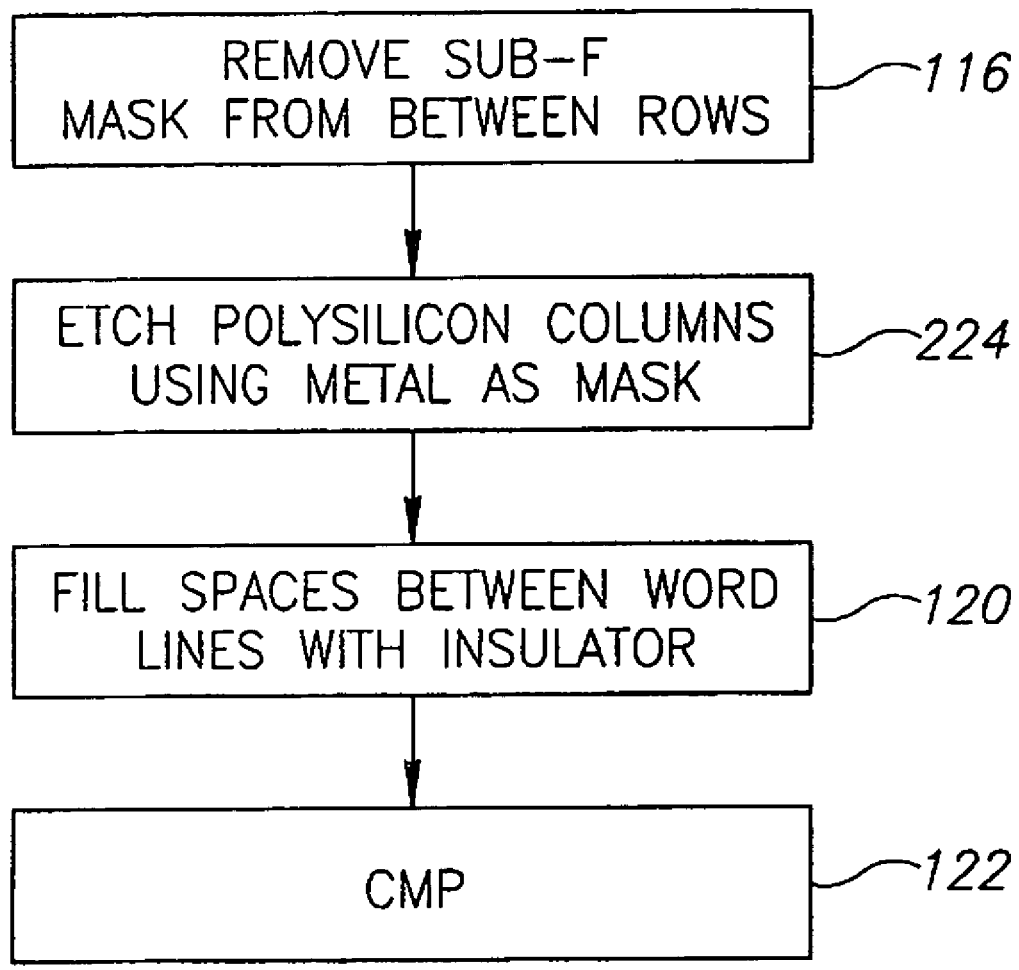

Reference is now made to FIGS. 9A and 9B, which illustrate an alternative embodiment of the present invention in which the word lines are formed of metal rather than of polysilicon. Reference is also made to FIGS. 10A-10D which illustrate the output of various steps of FIGS. 9A and 9B.

Applicants have realized that a "Dual Damascene" type process, used in semiconductor technology for creating metal lines (known as the "metal 1 layer") above the array, may be utilized herein to create metal word lines above polysilicon gates. This new process is shown in FIGS. 9A and 9B, which process is very similar to that shown in FIGS. 4A and 4B and thus, only the changed steps will be described hereinbelow.

The method begins with steps 100, 101, 102 and 104 of FIG. 4A to create the extended mask structure, formed from rows 60 and spacers 62', above polysilicon columns 54. The method may then deposit (step 220) even metal rows 221, such as copper or tungsten, into reduced spaces 61' rather than polysilicon rows 64 as before. Metal rows 221 may then be planarized, resulting in the structure shown in FIG. 10A.

The method then continues with steps 108 (removing $1^{st}$ mask) and 110 (creating extended mask) of FIG. 4A. However, in this embodiment, the extended mask is formed of even metal rows 221 and spacers 72'. In step 222, odd metal rows 223 may be deposited into spaces 70' (from FIG. 6G). Metal rows 221 may then be planarized, resulting in the structure shown in FIG. 10B.

Because even and odd rows 221 and 223, respectively, are formed of metal, there is no need to put an oxide cap on them, and thus, step 114 is not included in this embodiment.

Figure 10A:
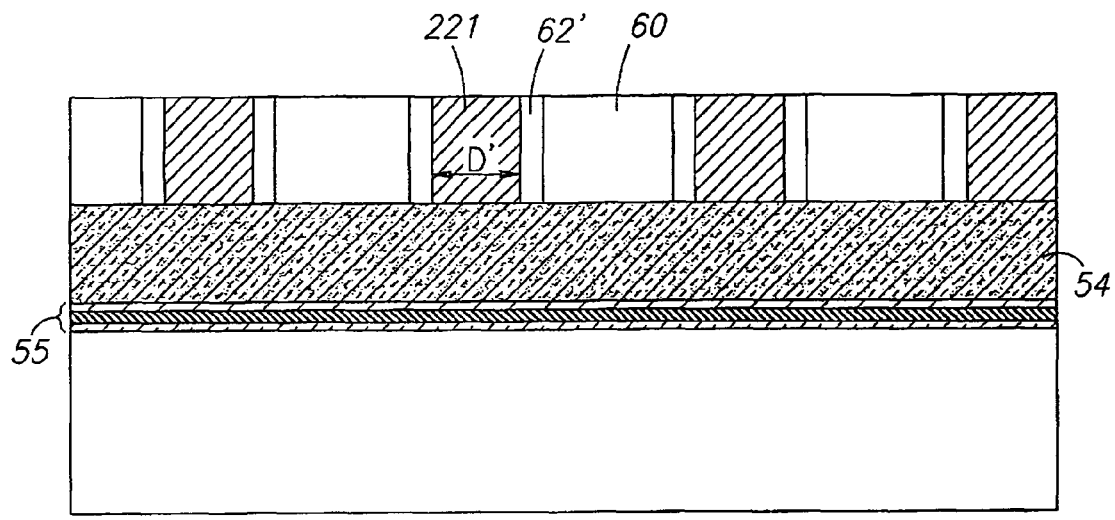
FIGS. 10A, 10B, 10C and 10D are schematic illustrations of various steps within the process of FIGS. 9A and 9B.
Figure 10B:
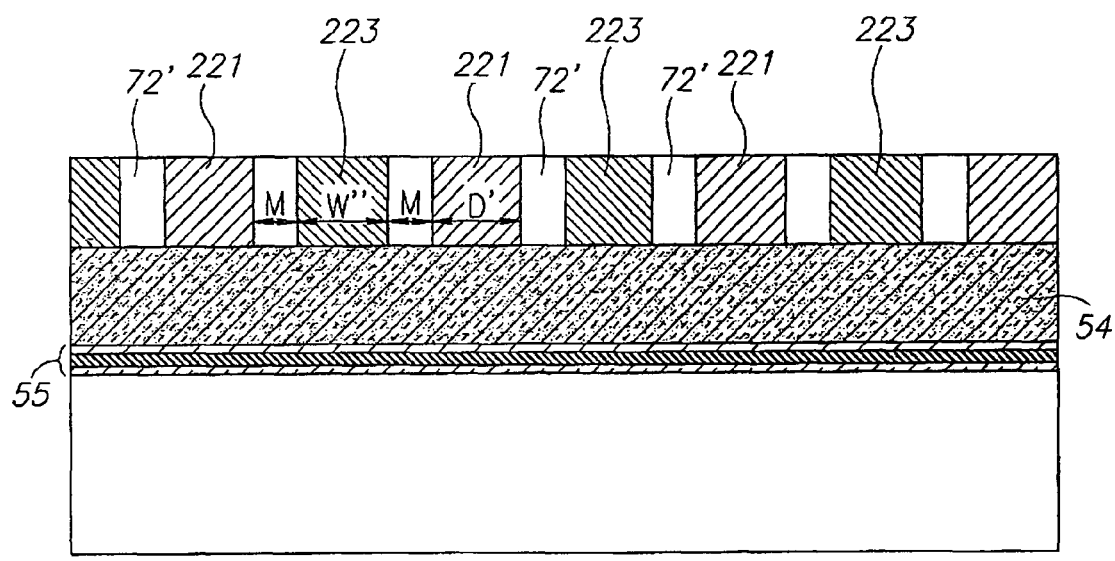
Figure 10C:
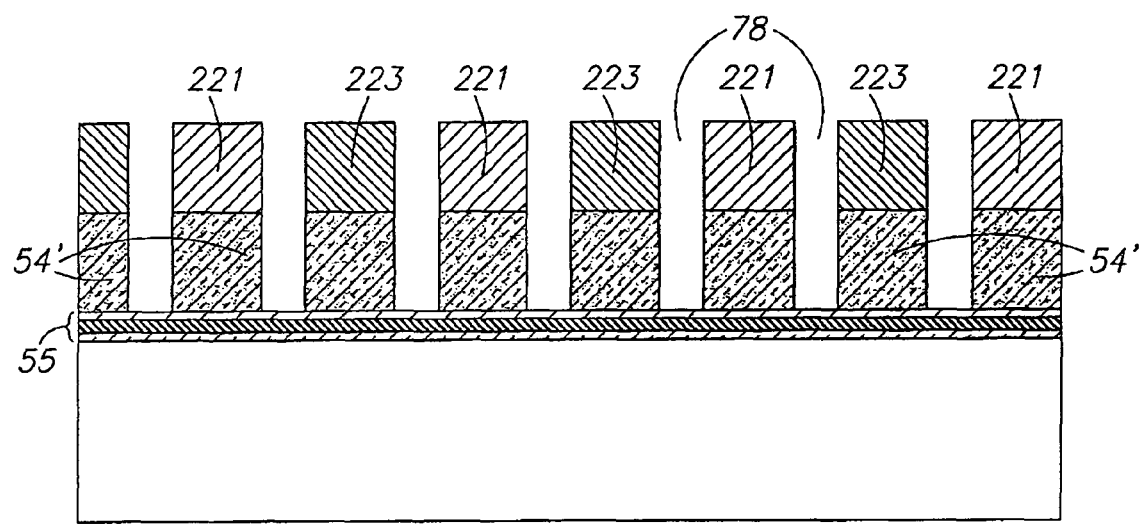
Figure 10D:
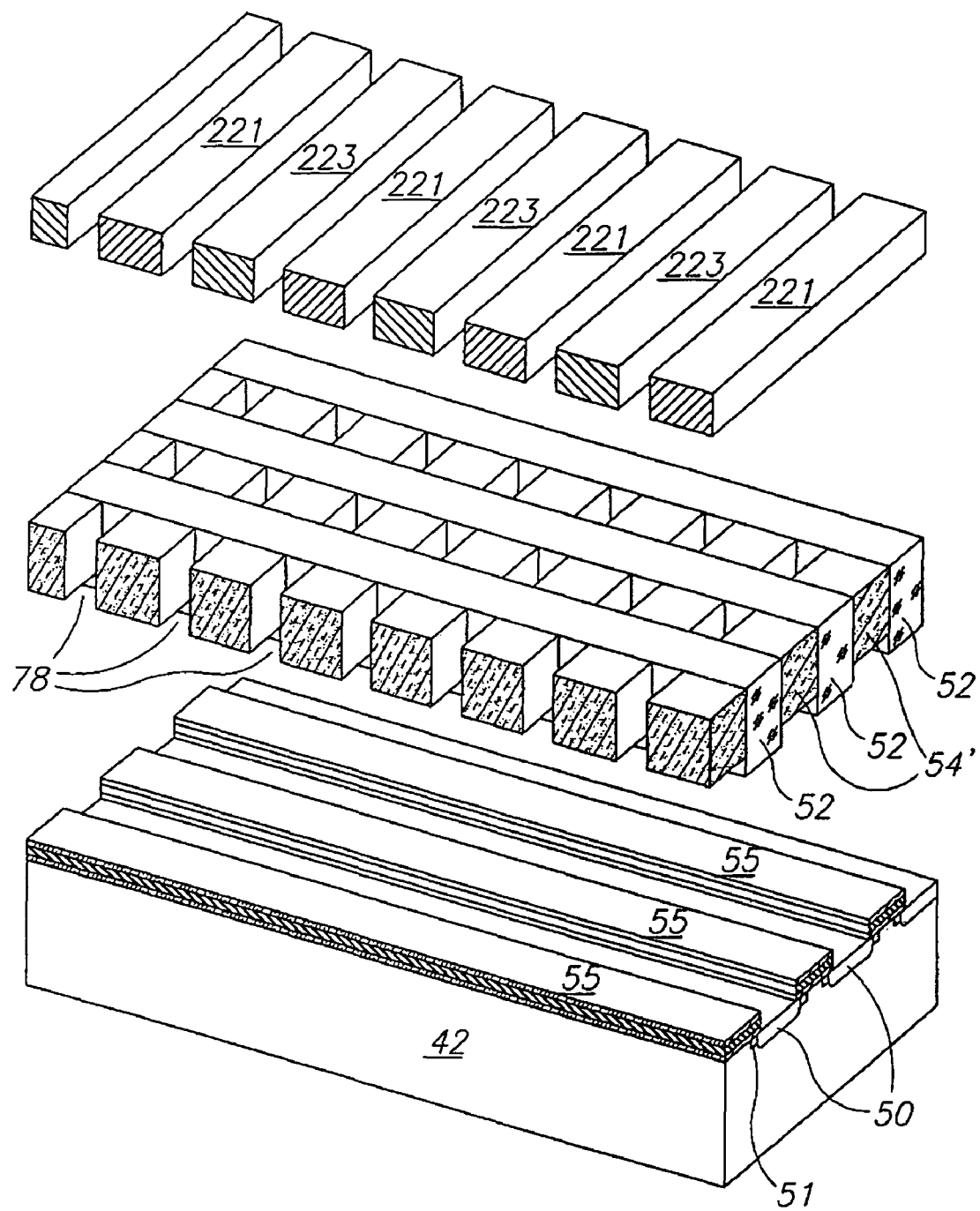

The method may proceed with removing (step 116) sub-F mask 72', leaving spaces between neighboring metal rows 221 and 223. In step 224, polysilicon columns 54 may be etched to create polysilicon gates 54', using metal rows 221 and 223 as masks for the etch. The result is shown in FIG. 10C and an expanded isometric view, showing gates 54' more clearly, is shown in FIG. 10D.

The process may continue as before, filling (step 120) the spaces between word lines with insulator and planarizing (step 122).

Spacer Embodiment

Applicants have realized that spacer technology may also be used to create sub-F word lines. The cell size may thus be reduced significantly by having 2 word lines in the same or a slightly larger pitch than in the prior art while still employing standard lithography. For example, there may be 2 word lines in a pitch of 2.8 F (translating to 1 word line in a 1.4 F pitch). Such an array may result in a cell size of less than the 4 $F^2$ theoretical minimum of the prior art. Accordingly, in an alternative preferred embodiment of the present invention, spacer technology may be used to produce a sub 2 F pitch for a word line.

Figure 11:
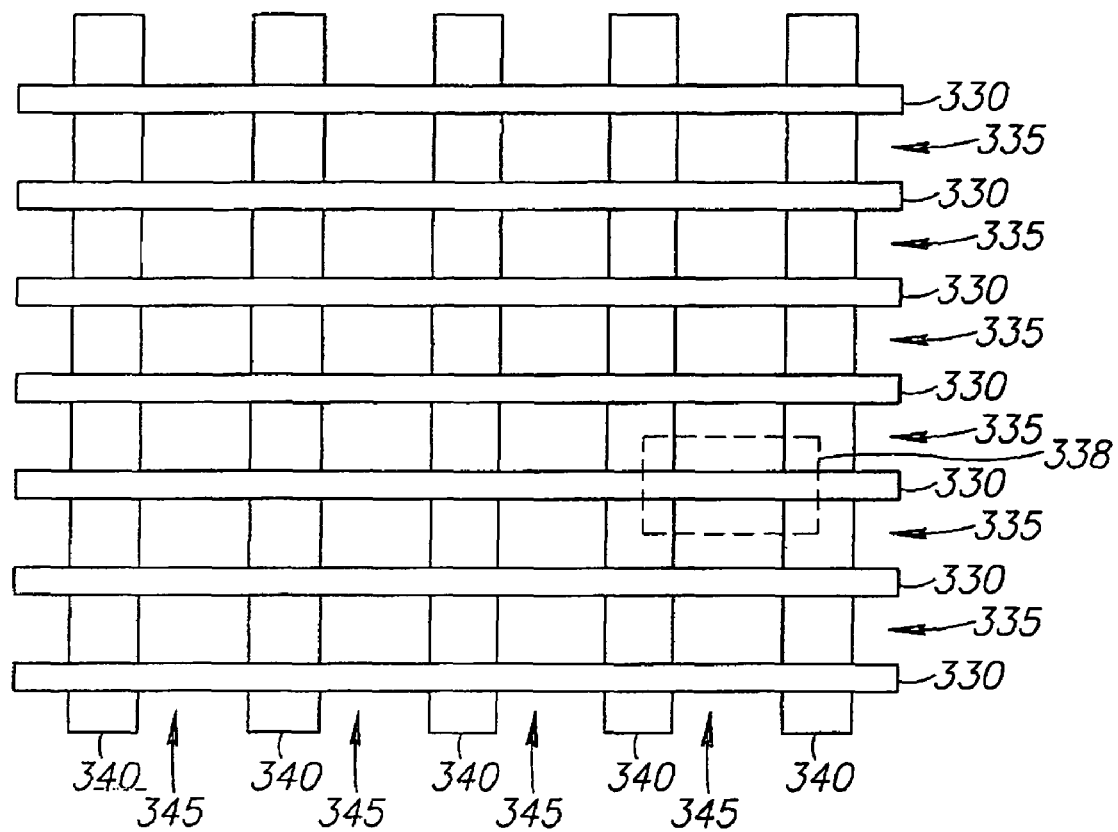
FIG. 11 is a schematic illustration of a layout of an array, constructed and operative in accordance with a preferred embodiment of the present invention.

Reference is now made to FIG. 11, which illustrates a novel, dense array 400, constructed and operative in accordance with the present invention. Array 400 may reduce the minimum size of a memory cell, by providing sub-minimum-feature-size, sub-F, spacer word lines 330 (with word line widths that are less than 1 F) along with feature-size or smaller width spaces 335 (where spacings 335 are 1 F or less).

For example, in FIG. 11, spacer word lines 330 are shown as an exemplary 0.4 F. It will be appreciated that the widths of spacer word lines 330 in FIG. 11 are exemplary; other sub-F widths are possible and are included in the present invention. Bit lines 340 and bit line spaces 345 may have, as in the DPP prior art, widths of 1 F and 1.6 F respectively.

Assuming a pitch of 2.6 F for the bit line dimension, the cell size of the example in FIG. 11 may be 2.6 F×1.4 F=3.64 $F^2$, which is less than the theoretical minimum (of 4 $F^2$) of the prior art. It will be appreciated that the word line and bit line pitches of the example in FIG. 11 are exemplary; other pitches are possible and are included in the present invention. The theoretical limits for the present invention are defined by a pitch of 1 F between spacer word lines 330 and a pitch of 2 F between bit lines 340. Accordingly an exemplary embodiment of the present invention may provide a cell 38 whose size is 1 F×2 F=2 $F^2$. It will therefore be appreciated that, by using spacers as the word lines, the present invention has redefined the theoretical minimum cell size. It will also be appreciated that the width of spacer word line 330 has a direct effect on the amount of current required for programming. Wider spacer word lines 330 may generally require higher currents for programming. Accordingly, as spacer word lines 330 may be less wide than the prior art of 1 F, they may in general require lower currents than in the prior art for programming, resulting in lower power consumption during programming.

It will be appreciated that the present invention may also be implemented in non-DPP type memory cells, and also for non-NROM type memory cells. Furthermore, the memory cells may store 2 bits or 4 bits, with no change in the basic physics and operating mode of the cell.

In accordance with a preferred embodiment of the present invention and as will be shown hereinbelow, sub-F elements may be generated from elements which are the minimum feature size F or larger. As will be described herein below, the present invention utilizes common lithographic concepts to generate such small features.

Figure 12:
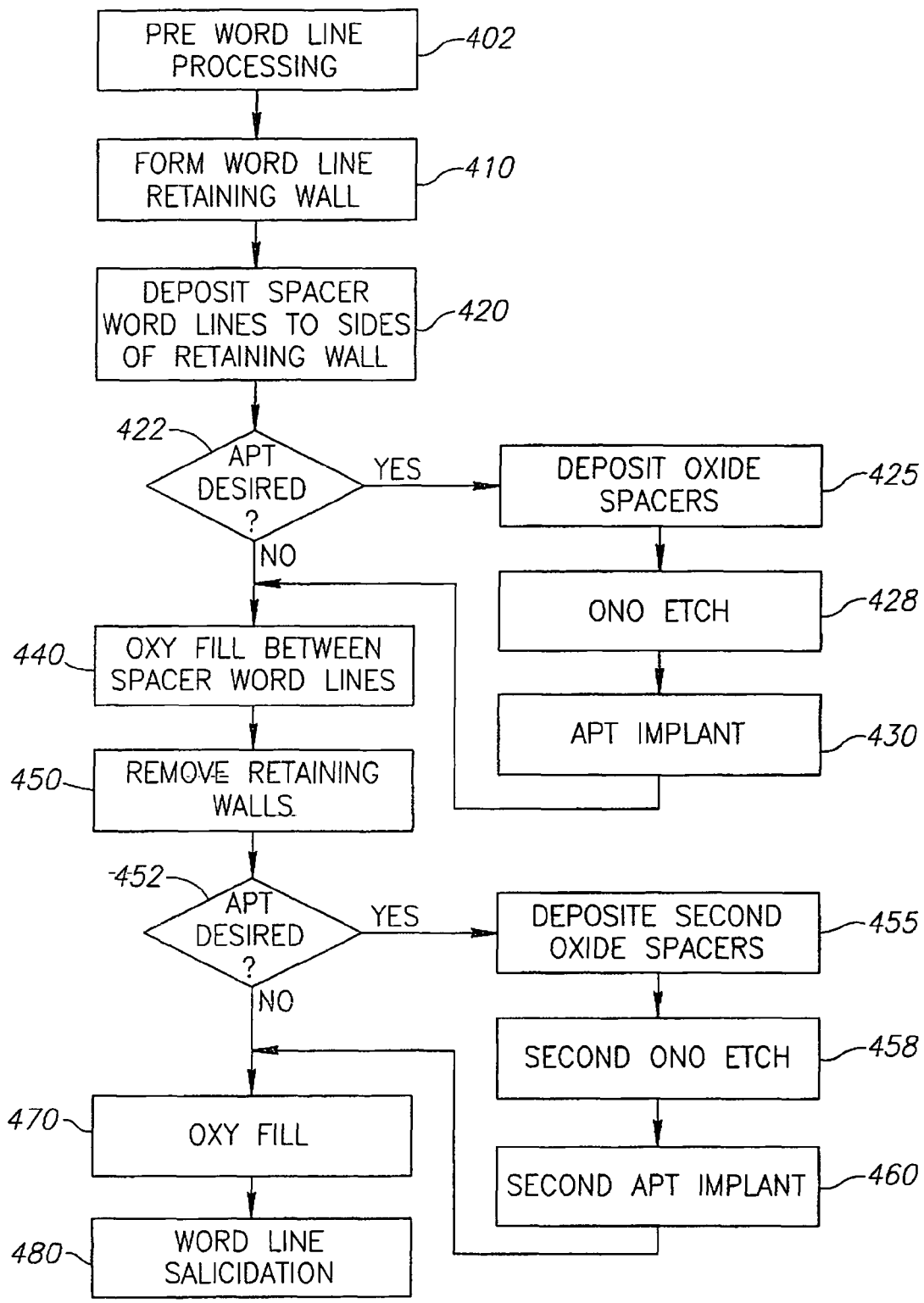
FIG. 12 is a flow chart illustration of a spacer word-line patterning method for creating the array of FIG. 11, constructed and operative in accordance with a preferred embodiment of the present invention.

Reference is now made to FIG. 12, which illustrates the process and to FIGS. 13A-26B, which illustrate various steps within the process of FIG. 12. FIG. 12 shows two alternative methods which will be described herein below, the first one, associated with FIGS. 13A-24B, which enables an anti-punchthrough implant between spacer word lines to be implanted and the second one, associated with FIGS. 25A-26B, which has no such anti-punchthrough implant.

Figure 13A:
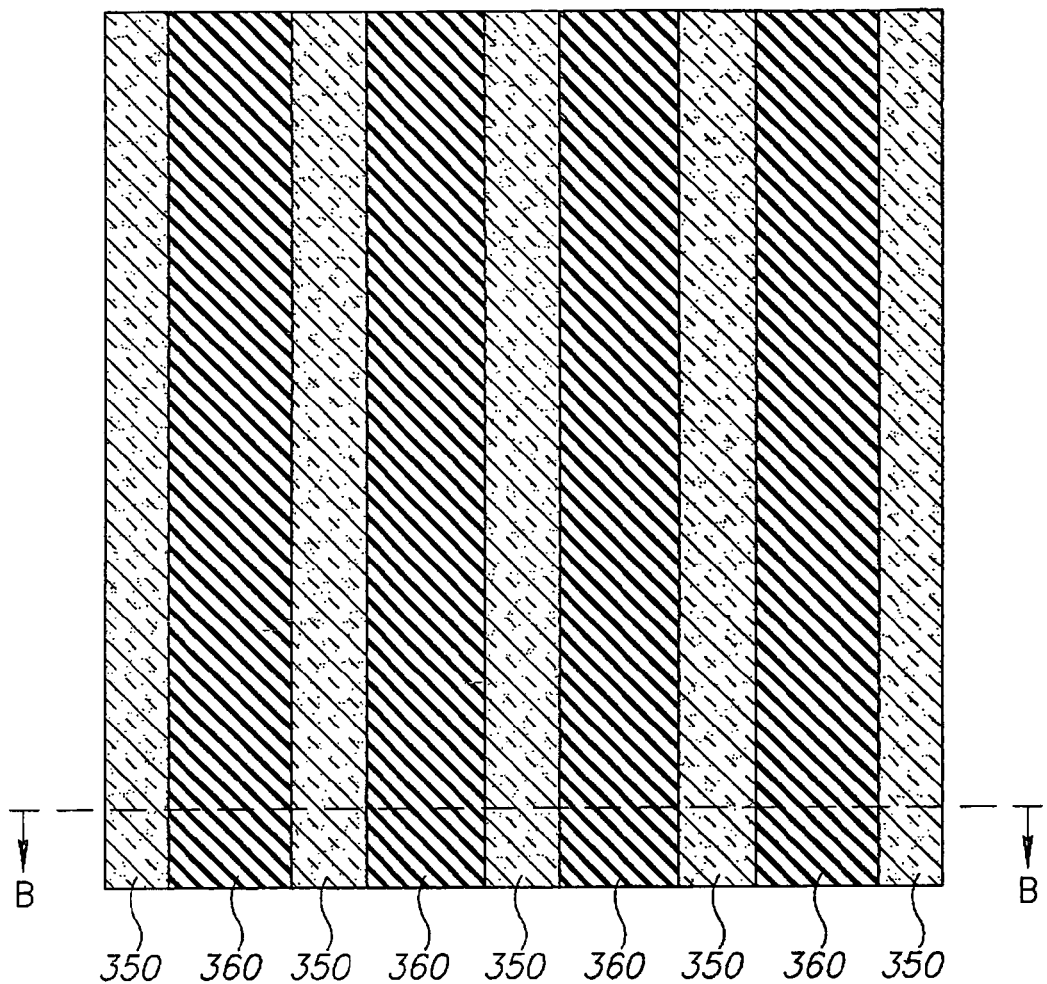
FIGS. 13A, 14A, 15A, 16A, 17A, 18A, 19A, 20A, 21A, 22A, 23A, 24A, 25A and 26A are top view illustrations of the results of various steps within the process of FIG. 12.
Figure 13B:
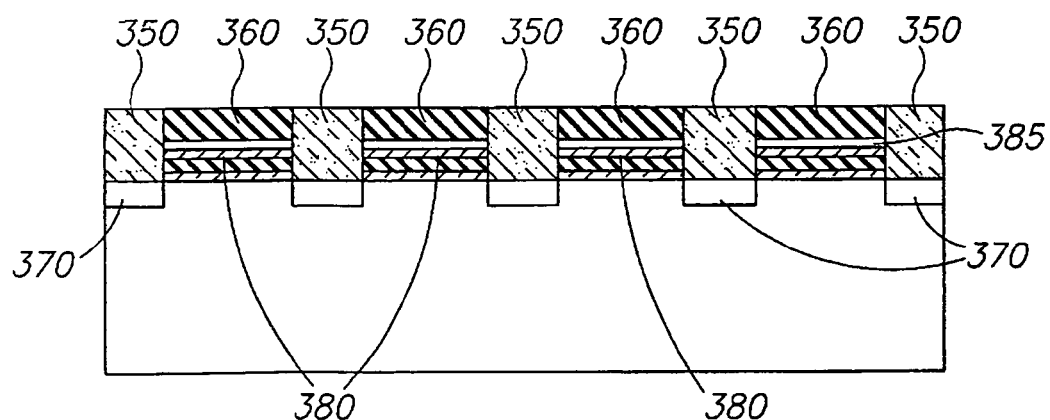
FIGS. 13B, 14B, 15B, 16B, 17B, 18B, 19B, 20B, 21B, 22B, 23B, 24B, 25B and 26B are cross sectional views of FIGS. 13A, 14A, 15A, 16A, 17A, 18A, 19A, 20A, 21A, 22A, 23A, 24A, 25A and 26A, respectively.

The process begins, in step 402, with the process steps prior to word line patterning. The results of these steps are illustrated in FIGS. 13A and 13B. FIG. 13A shows a top view of array 400, whereas FIG. 13B shows a cross section along horizontal lines B-B, viewing multiple bit lines 370. FIG. 13A shows alternating lines of oxide 350 and nitride 360. As shown in FIG. 13B, oxides 350 may be located on top of bit lines 370, which may, for example, be created with arsenic implants. Underneath nitrides 360 may be a polysilicon liner 385 and an oxide-nitride-oxide (ONO) layer 380. It will be appreciated that bit line oxides 350 and bit lines 370 may have been formed using a lithographic process, thus resulting in a bit line width of 1 F. In accordance with a preferred embodiment of the present invention, the width of nitrides 360 and ONO layer 380 may be 1.6 F, with a minimum limit of 1 F.

The pre-word line patterning process steps may be any suitable set of steps, an exemplary set of which may be found in the following applications assigned to the common assignees of the present invention, which applications are incorporated herein by reference: U.S. patent application Ser. No. 11/247,733 filed Oct. 11, 2005, U.S. patent application Ser. No. 11/336,093 filed Jan. 20, 2006 and U.S. patent application Ser. No. 11/440,624, filed 24 May 2006.

Returning to FIG. 12, the first step in word line processing is to form (step 410) retaining walls next to which the spacer word lines may be deposited using a conductive material such as, for example, polysilicon. As shown from above in FIG. 14A, initially, the entire array 400 may be covered with a second layer of nitride 390 which may constitute a hard cap for lithographic purposes. A cross-sectional view in FIG. 14B shows how nitride 390 may cover the previously deposited materials.

Figure 14A:
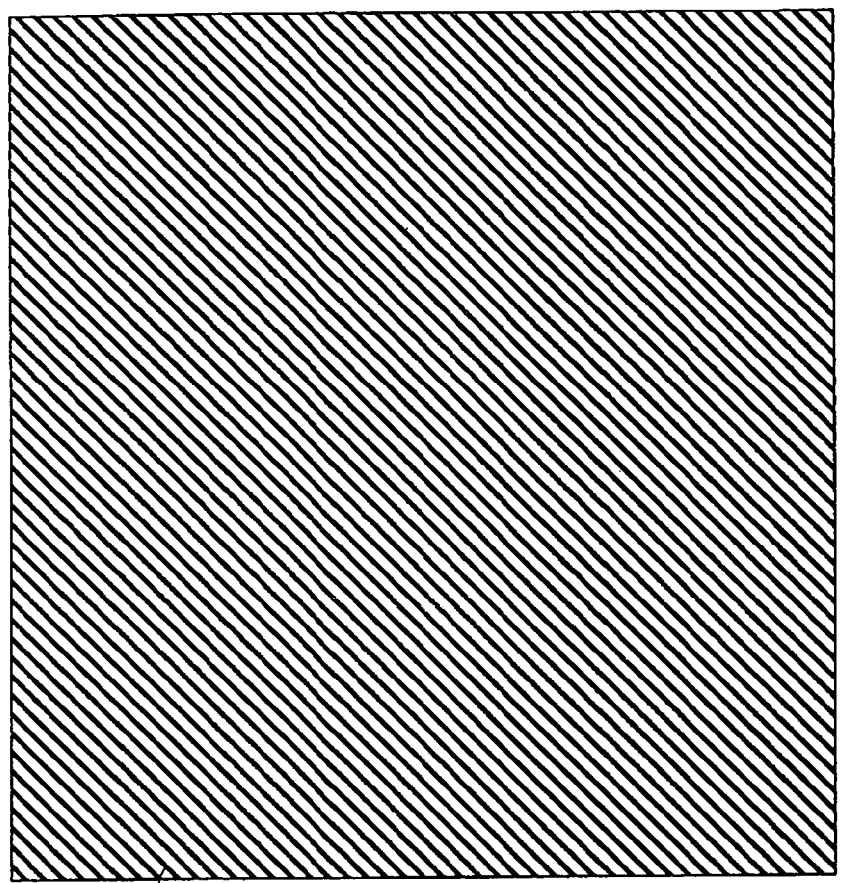
Figure 14B:
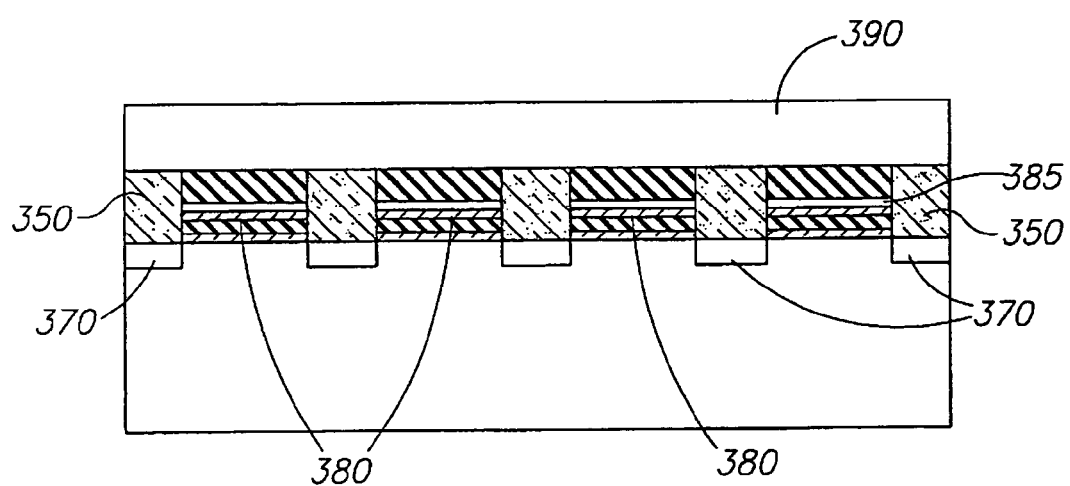
Figure 15A:
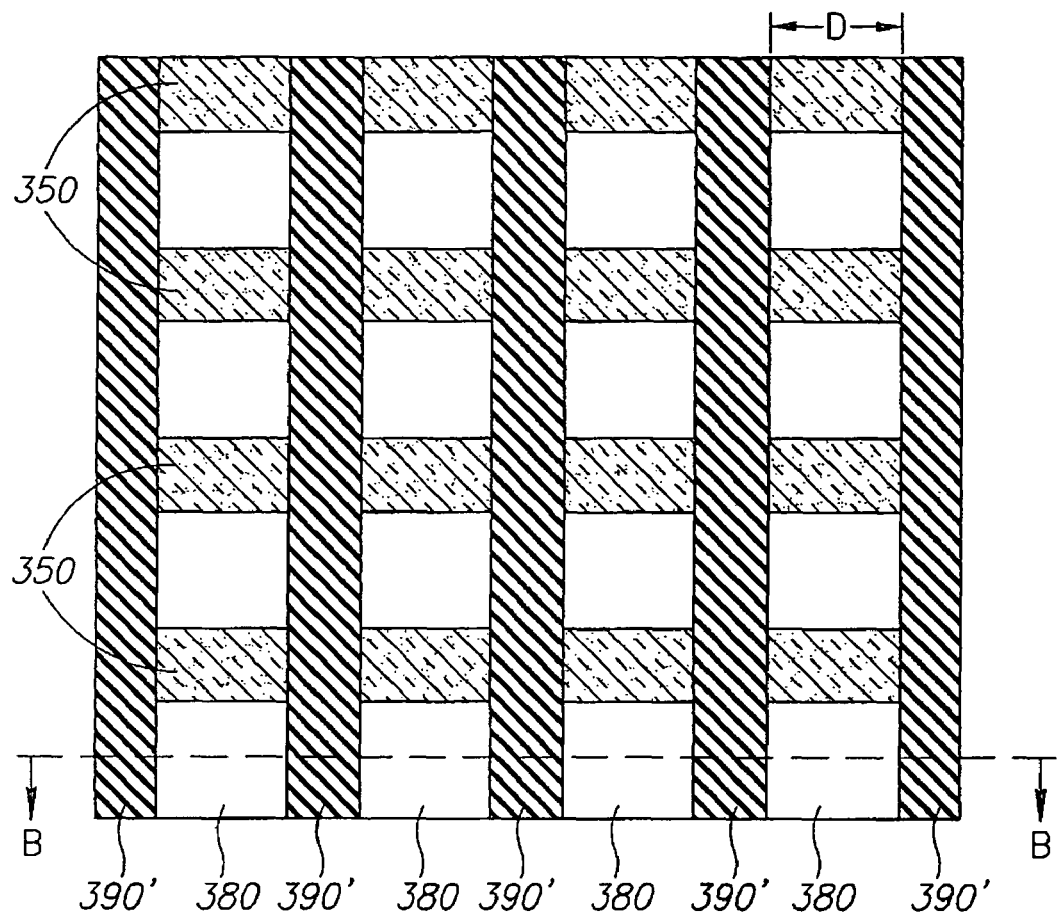

FIG. 15A illustrates a top view of array 400 that has been rotated 90 degrees in a clockwise direction when compared to FIG. 14A. This figure illustrates how nitride 390 may then be etched to create word line retaining walls 390'. Elements of polysilicon liner 385 exposed by this operation may then be removed as well with a wet etch. It will be appreciated, that the width of word line retaining walls 390' may be 1 F or larger, due to the restrictions of lithographic operations. In a preferred embodiment of the present invention, the distance D between each word line retaining wall 390' may be, for example, 1.8 F.

It will be appreciated that the mask for etching nitride 390 may be the same or similar to the prior art mask for generating word lines. However, in the present invention, the mask is used to create retaining walls 390'.

Figure 15B:
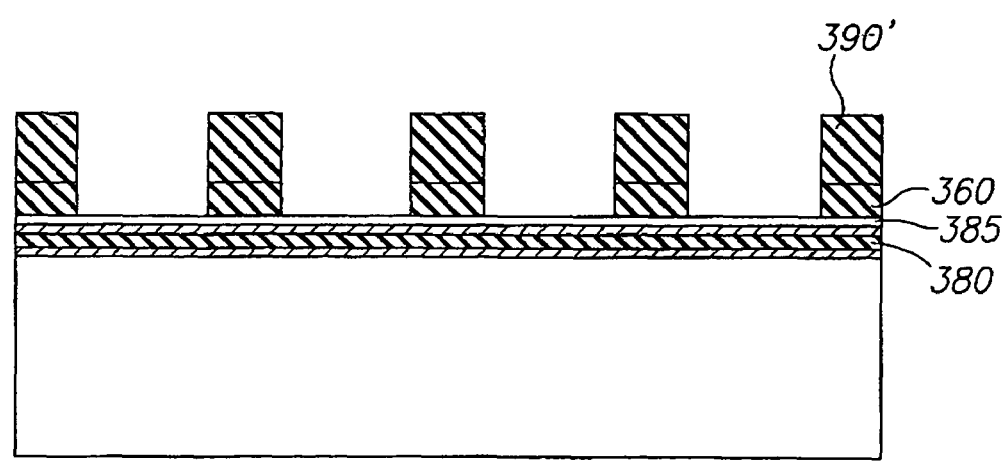

FIG. 15B shows a vertical cross-section along lines B-B, viewing multiple word lines. FIG. 16B illustrates how the remaining elements of nitride 360 provide a base for word line retaining walls 390'. It will thus be appreciated that both retaining walls 390' and nitride 360 consist of the same material and may later be removed in a single step.

Figure 16A:
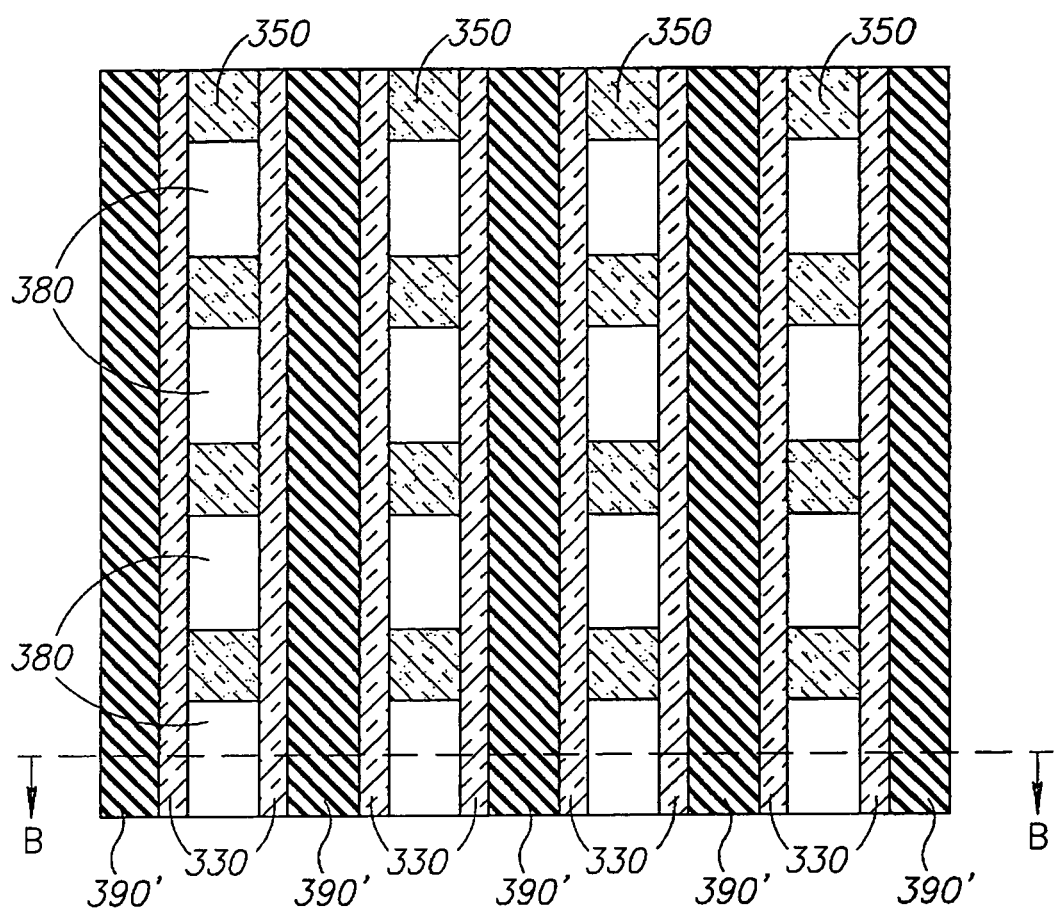
Figure 16B:
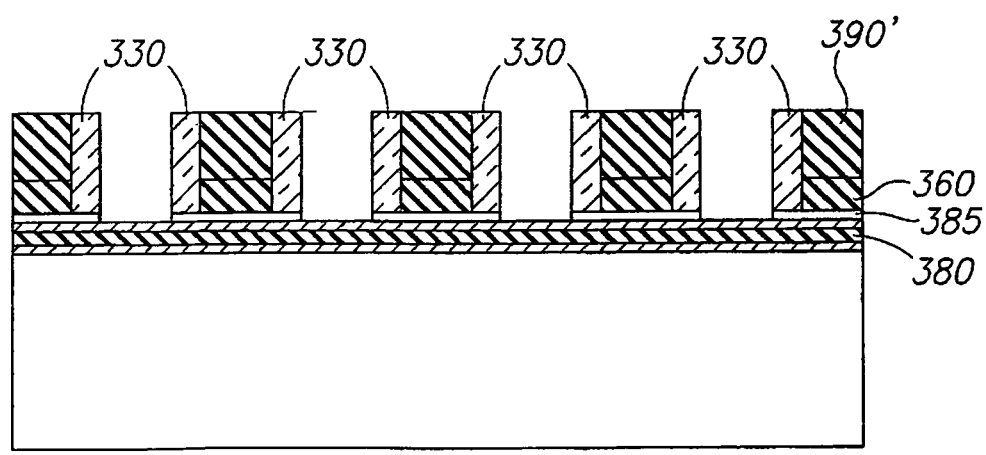

As shown in FIG. 16A, spacer word lines 330 may then be generated (step 420) as polysilicon spacers adjacent to word line retaining walls 390'. The polysilicon spacers may be generated by first laying down a polysilicon liner and then etching the liner back. A Reactive Ion Etching (RIE) may be used to guarantee continuity of spacer word lines 330 over bit line oxides 350.

FIG. 16B shows a cross-sectional view of array 400 after spacer word lines 330 have been generated. It will be appreciated that spacer word lines 330 may be spacers and not created lithographically. Accordingly, spacer word lines 330 may have widths of less than 1 F. In accordance with an exemplary embodiment of the present invention, the width of spacer word lines 330 may be 0.4 F.

It will be appreciated that the width of spacer word lines 330 may no longer be affected by the limitations of lithography. Spacer dimensions may depend only on layer thickness in deposition and may therefore theoretically reach atomic dimensions. However, in light of practical considerations such as narrow channel effects, cell width variations and more, the minimum width for spacer word lines 330 may be defined as 0.1 F.

Figure 17A:
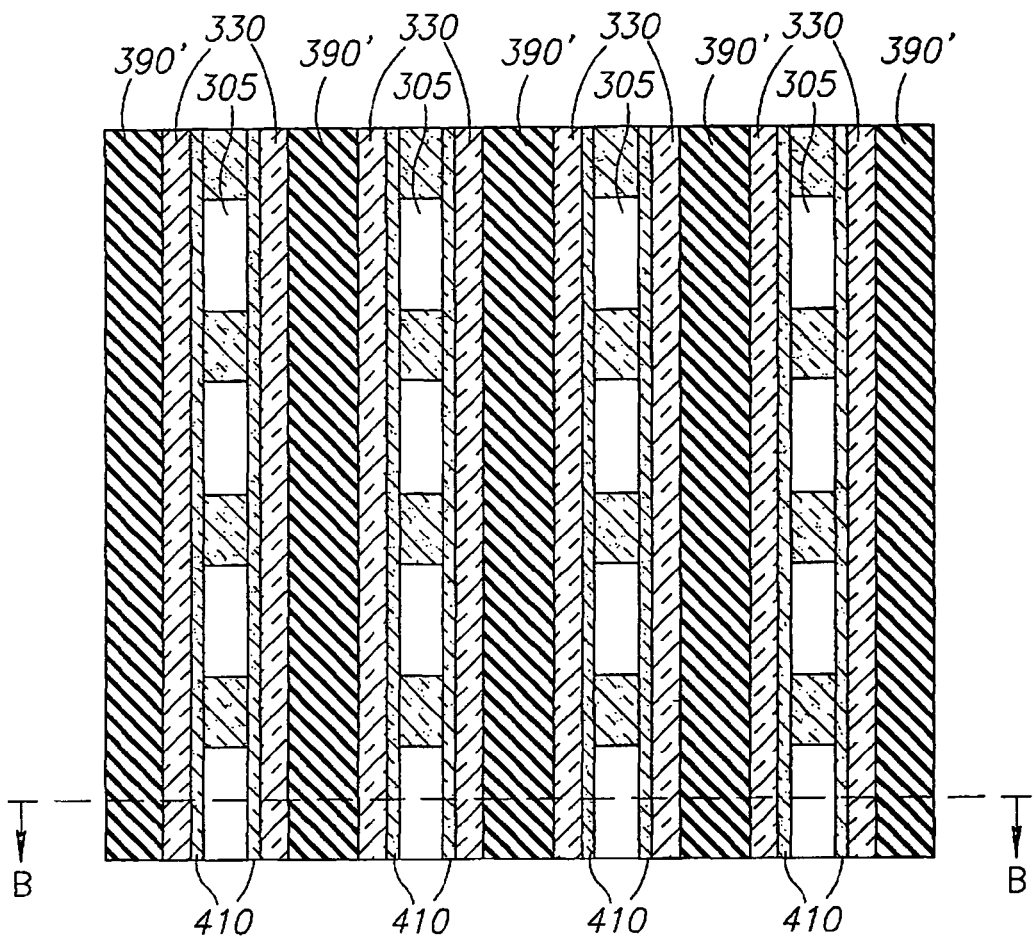
Figure 17B:
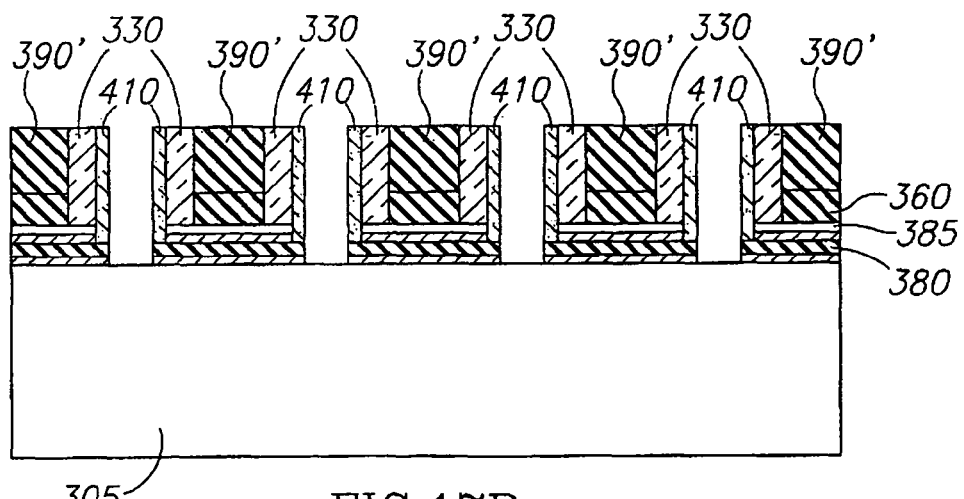

In accordance with a preferred embodiment of the present invention, anti punch through (APT) implants may be included in the process. If anti punch through (APT) implants are required (as checked in step 422), oxide spacers 410 may then be deposited (step 425) adjacent to spacer word lines 330 (FIG. 17A). It will be appreciated that oxide spacers 410 may be located on top of ONO 380 and may provide support to spacer word lines 330 during an implant process. ONO 380 may then be etched (step 428) in order to facilitate an anti punch through (APT) implant. FIG. 17B provides a cross sectional view of FIG. 17A and illustrates the results of such etching. Elements of ONO 380 may remain under spacer word lines 330, spacer word line retaining walls 390', and oxide spacers 410. However, between oxide spacers 410, substrate 305 may now be exposed.

Figure 18A:
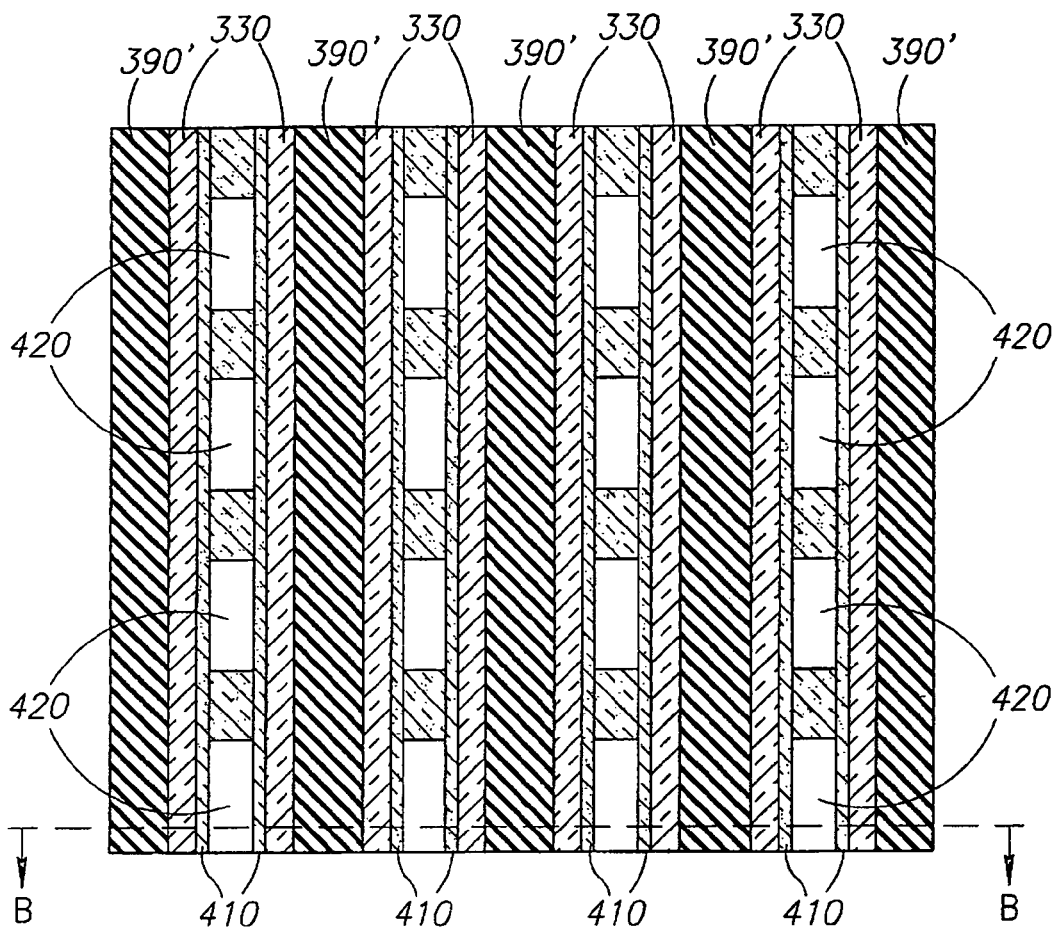
Figure 18B:
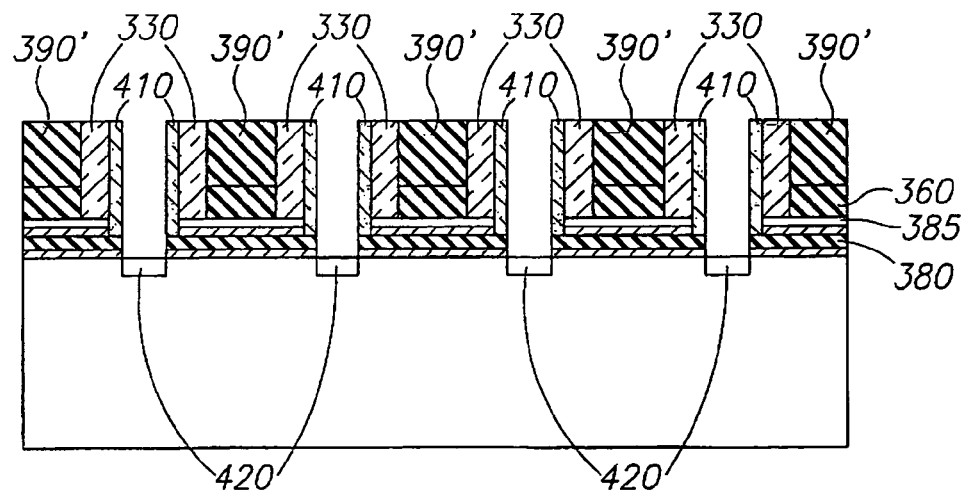
Figure 19A:
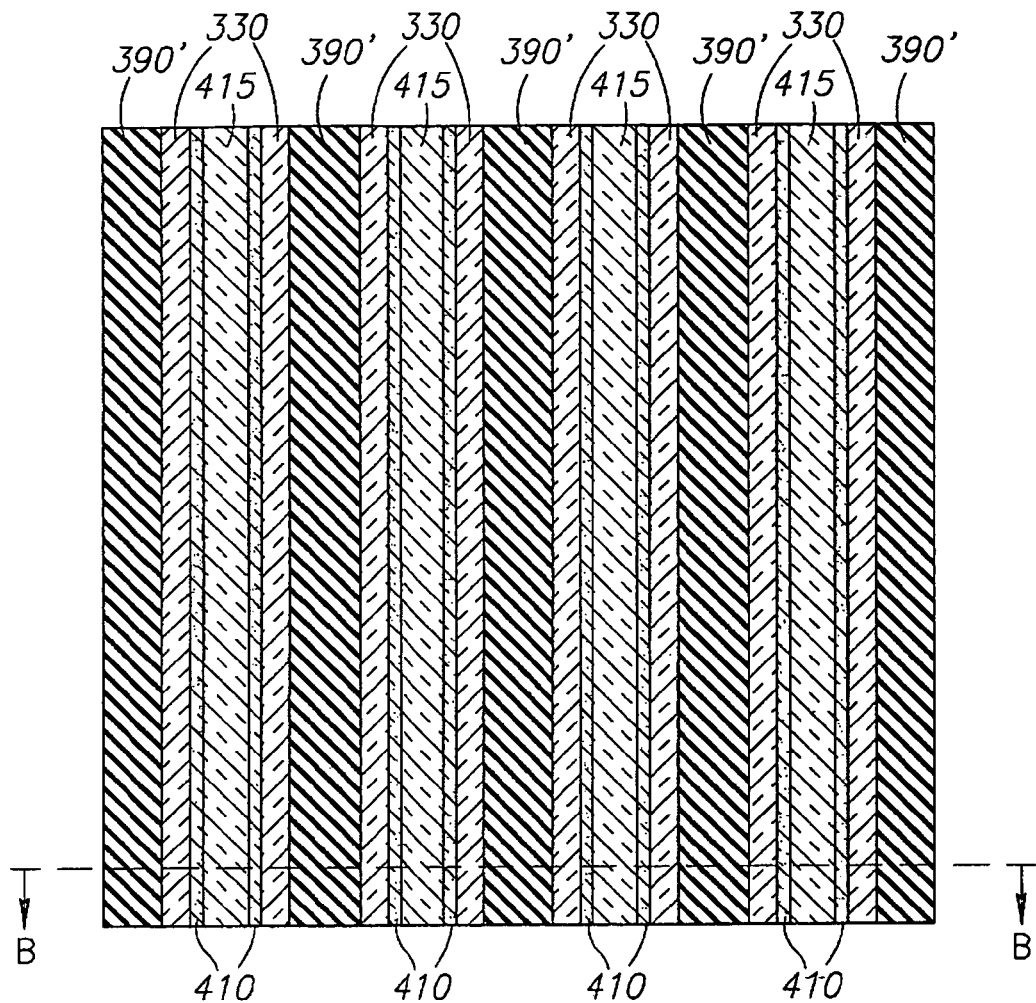
Figure 19B:
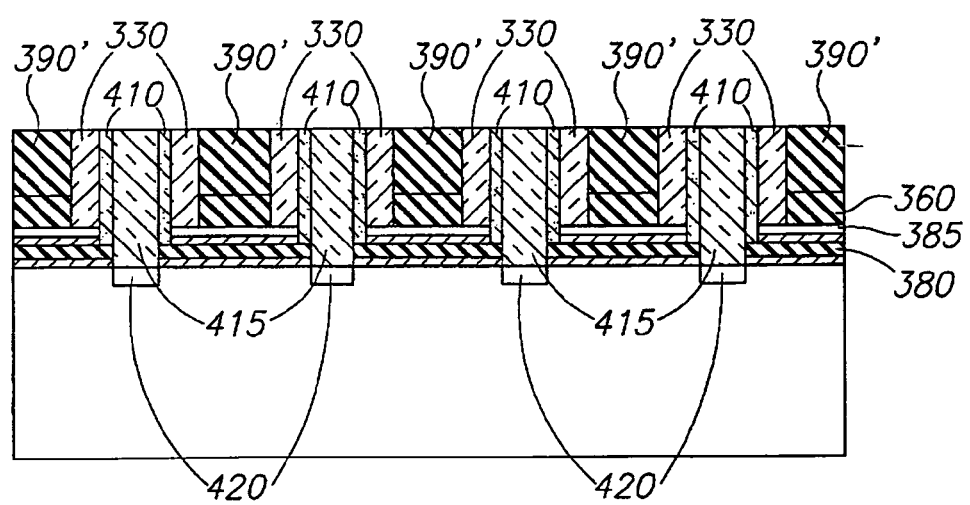

As illustrated in FIGS. 18A and 18B, a first set of APT implants 420 may now be implanted (step 430) in the exposed elements of substrate 305. As shown in FIGS. 19A and 19B, an oxide filler 415 may then be deposited (step 440) over first APT implants 420.

It will be appreciated that steps 425 and 428 are optional. In an alternate embodiment of the present invention, APT implants 420 may be implanted (step 430) directly through ONO layer 380 without depositing oxide spacers 410 or etching ONO layer 380. Oxide filler 415 may then be deposited (step 340) in the area containing both oxide spacers 410 and oxide filler 415 in the previous embodiment.

In accordance with a preferred embodiment of the present invention, array 400 may also be planarized at this point to remove excess oxide fill. An exemplary planarizing operation may be chemical-mechanical polishing (CMP). Thus, as illustrated in FIG. 19B, array 400 may now be filled to a uniform height. It will be appreciated the oxide spacers 410 and oxide filler 415 may consist of the same material and accordingly may now in effect comprise a uniform filler between spacer word lines 330.

Figure 20A:
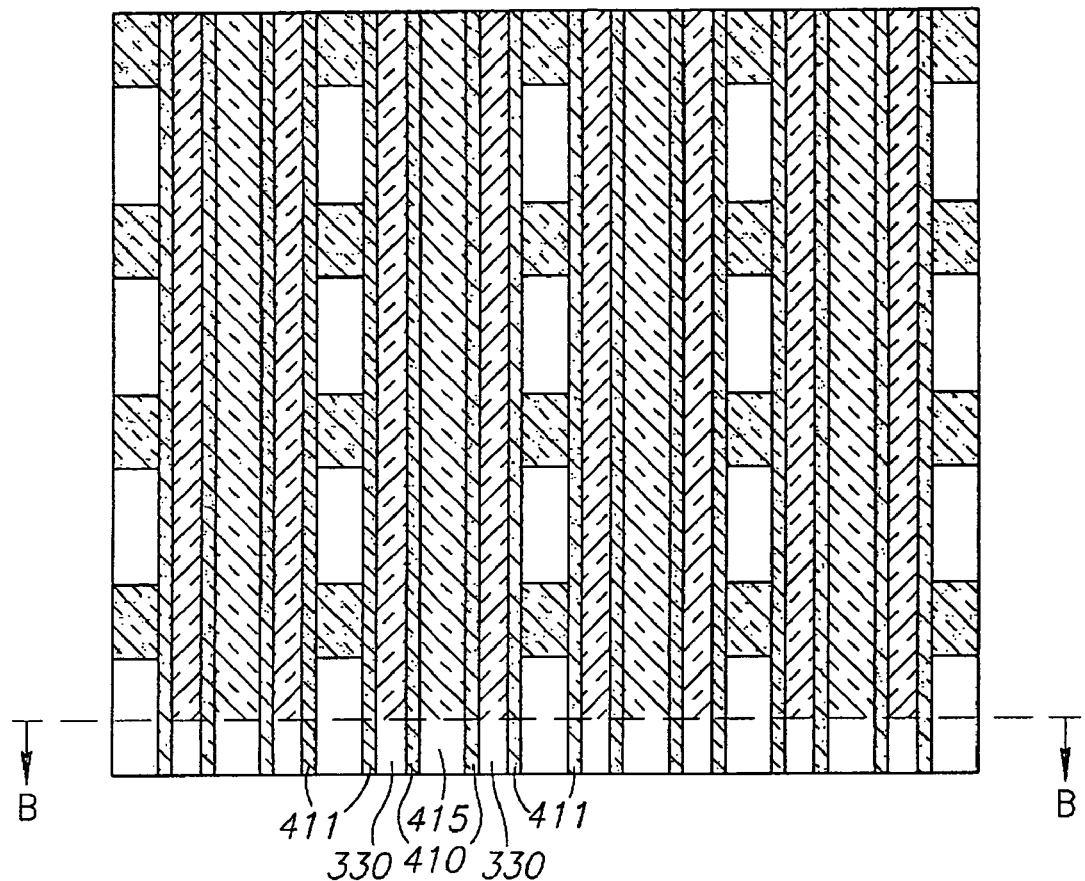
Figure 20B:
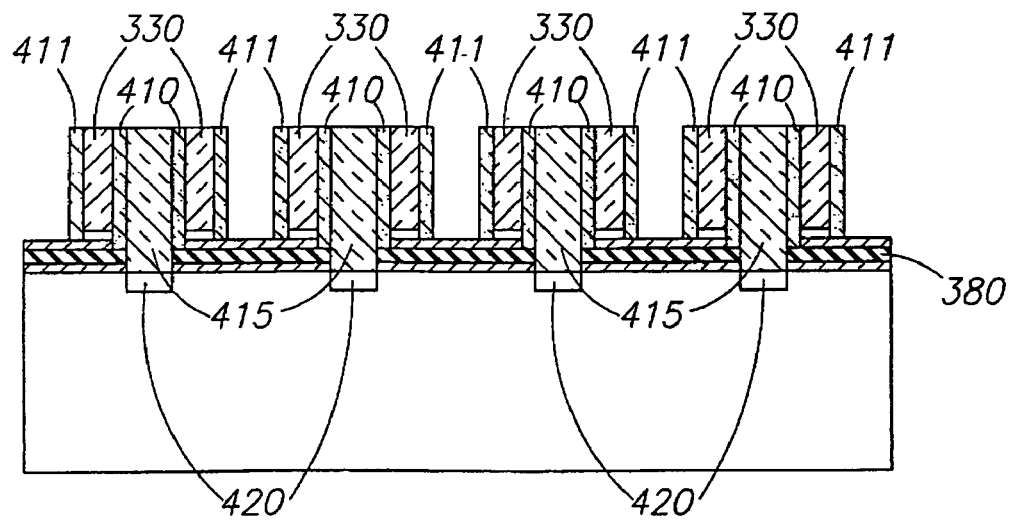

Word line retaining walls 390' may now be removed (step 450), such as with a nitride etch. If anti punch through (APT) implants are required (as checked in step 452), oxide spacers 411 may then be deposited (step 455) adjacent to spacer word lines 330. FIGS. 20A and 20B show the results of step 455. Bit line oxides 370 and ONO layer 380 have been exposed from underneath the removed retaining walls 390'. Oxide spacers 411 are next to spacer word lines 330 and may partially cover elements of ONO 380 that had previously been exposed by the removal of word line retaining walls 390'.

Figure 21A:
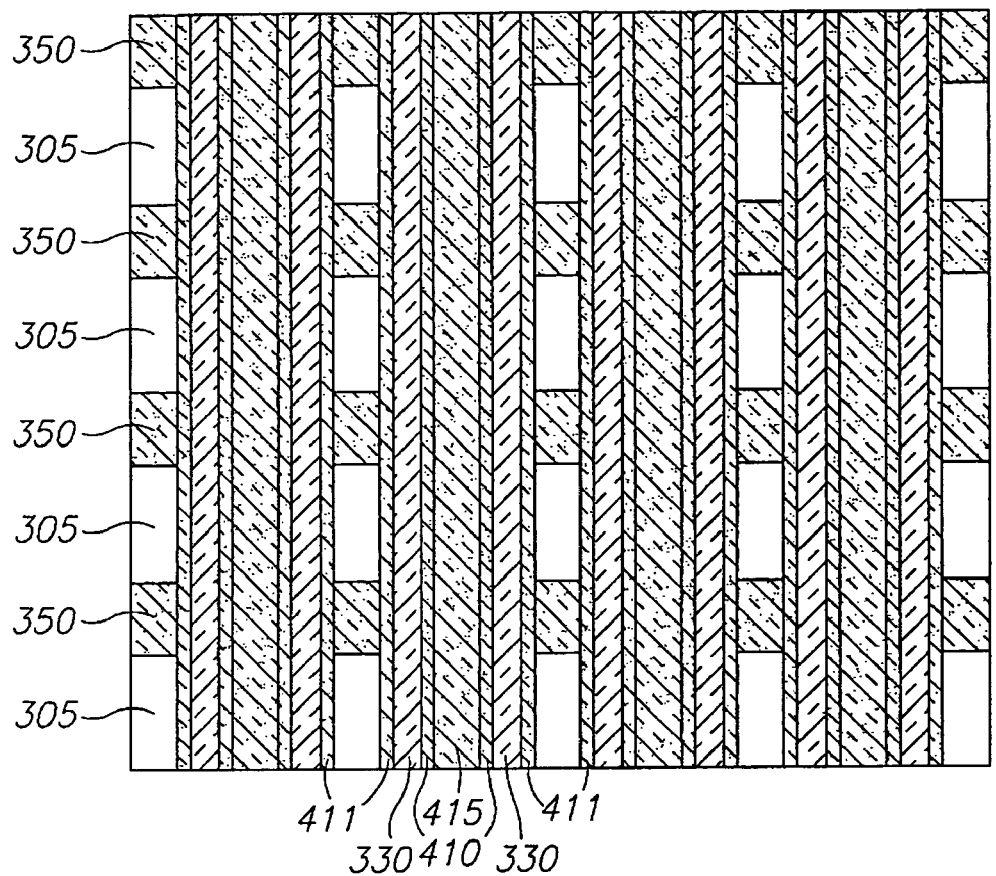
Figure 21B:
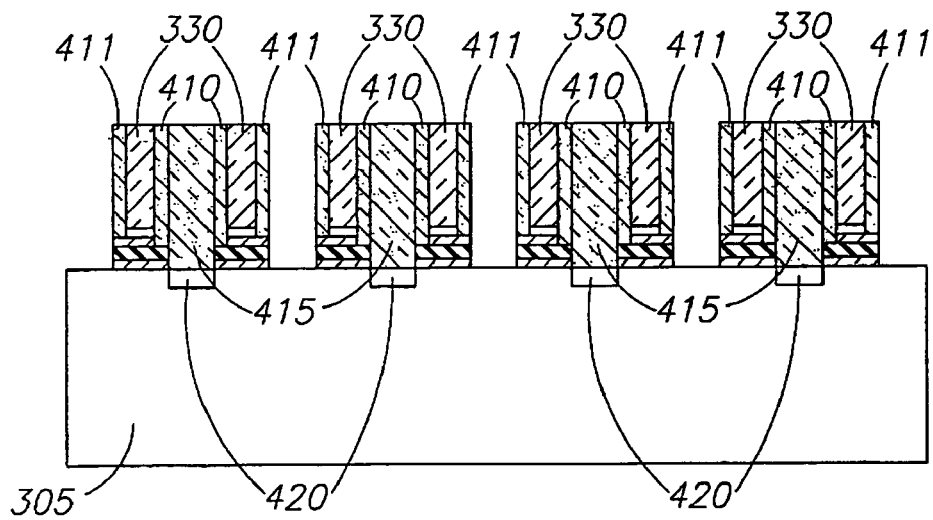

In accordance with a preferred embodiment of the present invention, the remaining exposed portions of ONO 380 may then be etched (step 458) in order to facilitate a second APT implant. FIGS. 21A and 21B illustrate the results of such etching. Similar to the preparation for first APT implants 420 (FIGS. 17A and 17B), substrate 305 may now be exposed, and elements of ONO 380 may remain under spacer word lines 330 and oxide spacers 410 and 411. However, now there may be no remaining word line retaining walls 390'.

Figure 22A:
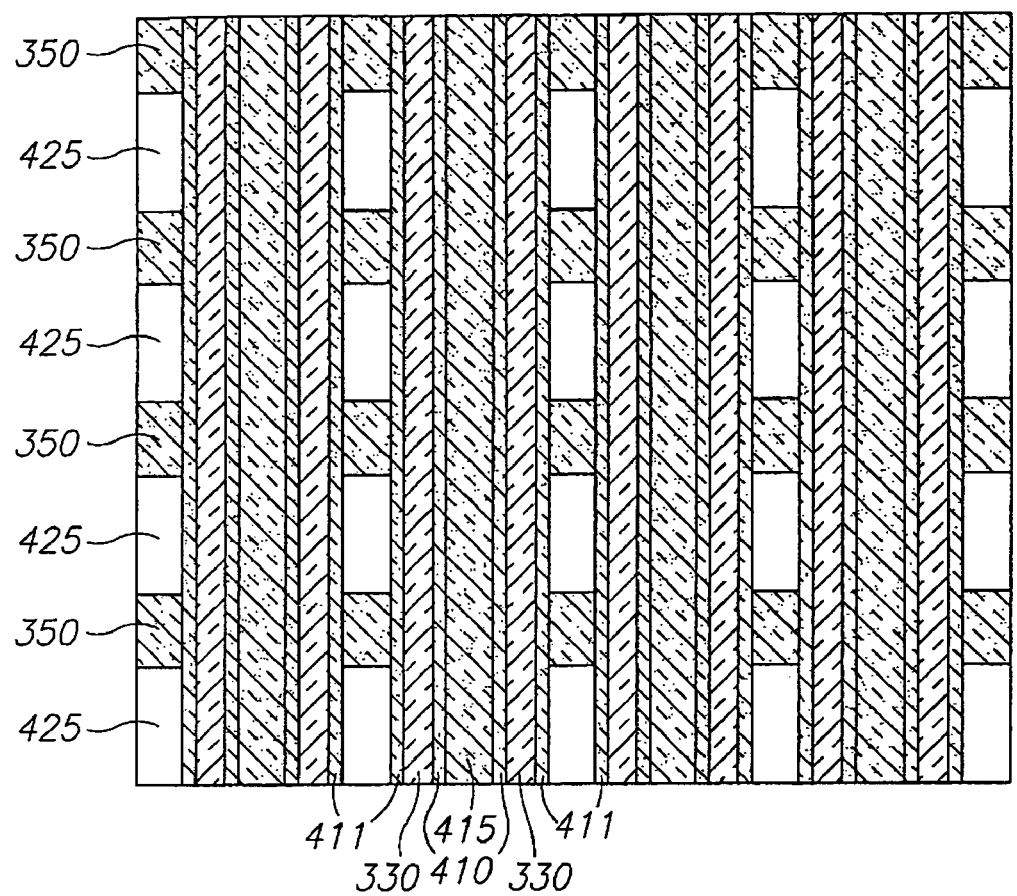
Figure 22B:
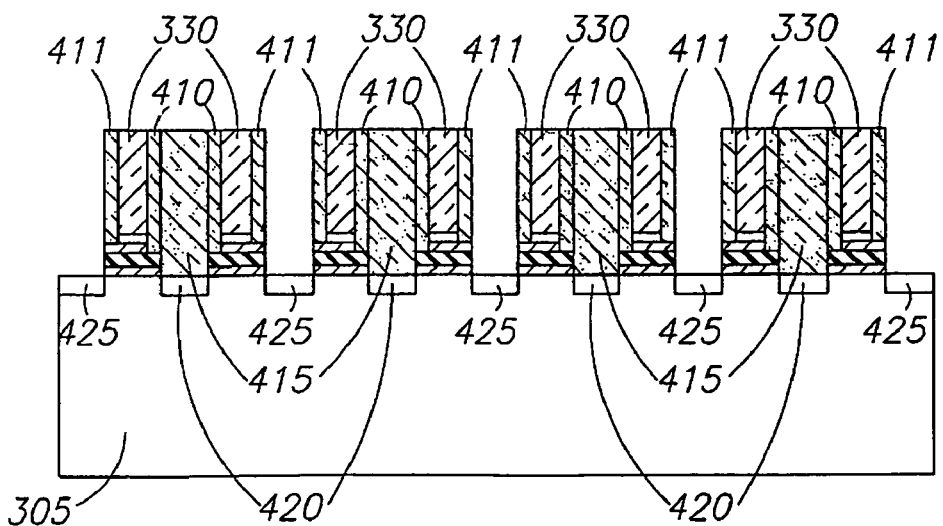
Figure 23A:
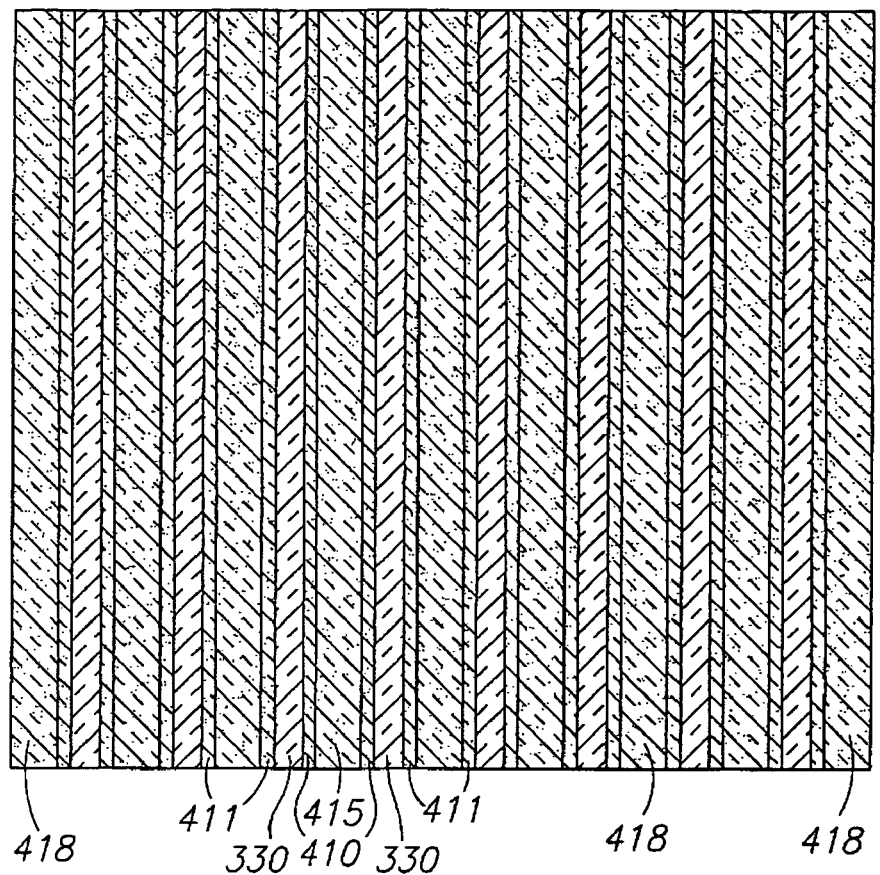

As illustrated in FIGS. 22A and 22B, a second APT implant 425 may then be implanted (step 460) in exposed substrate 305. FIG. 23A shows how an oxide fill 418 may then be deposited (step 470) to cover APT implant 425.

It will be appreciated that steps 455 and 458 are optional. In an alternate embodiment of the present invention, APT implants 425 may be implanted (step 460) directly through ONO layer 380 without depositing oxide spacers 411 or etching ONO layer 380. Oxide filler 418 may then be deposited (step 440) in the area containing both oxide spacers 410 and oxide filler 418 in the previous embodiment.

Figure 23B:
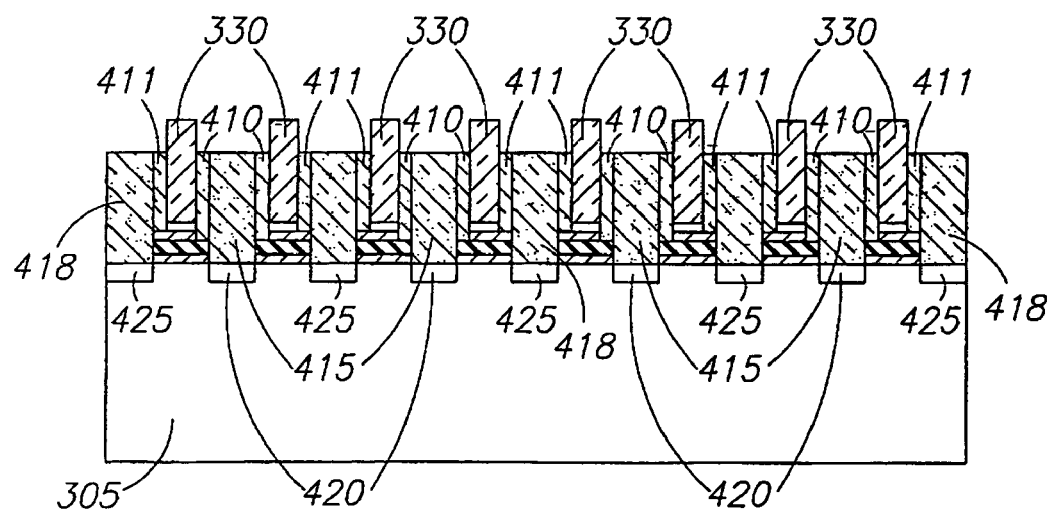

After oxide fill 418 is deposited, array 400 may be planarized as in step 440, using for example, a CMP process to remove excess oxide filler 418 above the level of spacer word lines 330. After the CMP process is performed, the only exposed elements remaining may be the polysilicon from spacer word lines 330 and oxides 410, 411, 415, and 418. An oxide etch-back may then be employed to expose spacer word lines 330 to a depth of, for example, approximately twice the spacer thickness for example. The cross sectional view in FIG. 23B illustrates the results of this etch. Spacer word lines 330 may rest on ONO 380 and may extend above surrounding oxides 410, 411, 415 and 418. It will also be appreciated that portions of ONO 380 may also extend underneath oxide spacers 410 and 411.

Figure 24A:
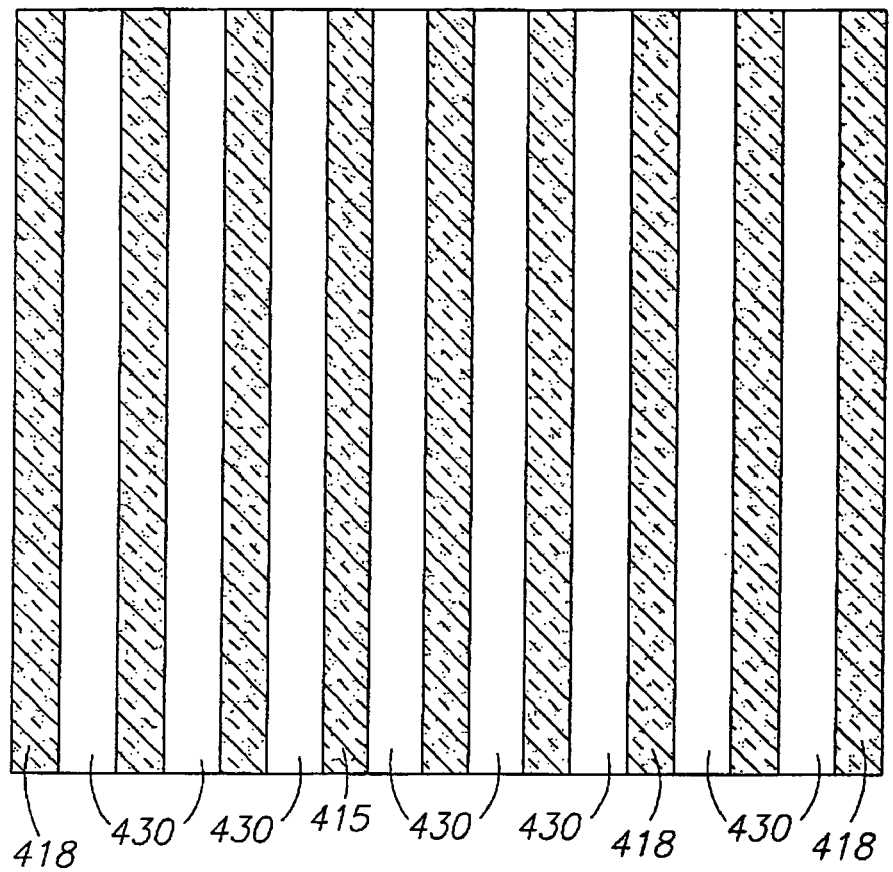
Figure 24B:
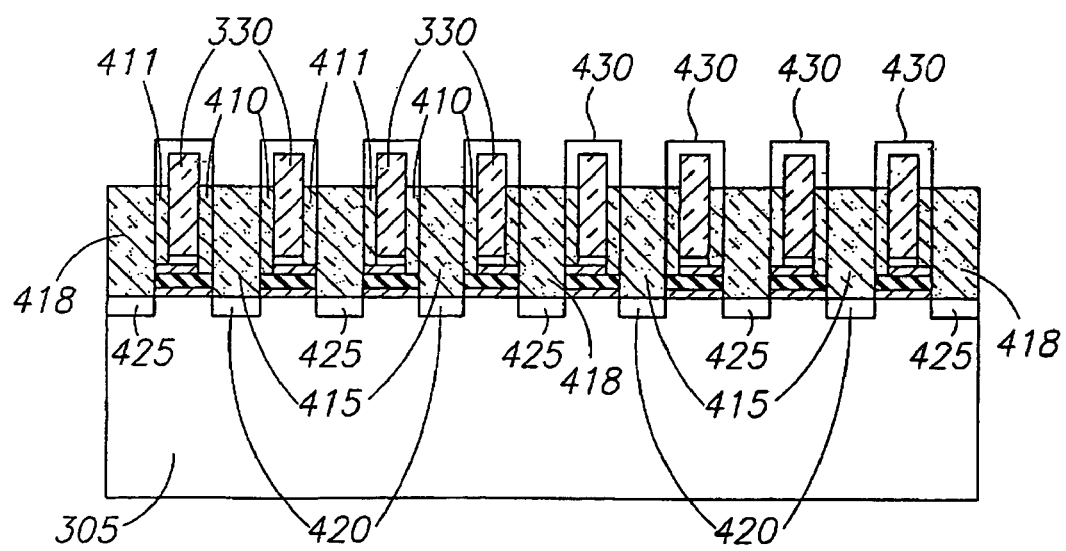

As illustrated in FIGS. 24A and 24B, spacer word line salicidation may now be performed (step 480) to salicide the exposed spacer word lines 330. For example, cobalt or tungsten may be used in this process. This step may complete the creation of array 400.

It will be appreciated that, as stated hereinabove, the width of spacer word lines 330 may be 0.4 F. It will also be appreciated that the combined width of an oxide 410, oxide 415 and a second oxide 410 may be 1 F. Similarly, the combined width of an oxide 411, oxide 418 and a second oxide 411 may also be 1 F. Accordingly, it will be appreciated that array 400 may have a pitch of one word line for every 1.4 F, as opposed to the previous minimal pitch of one word line per 2 F as described hereinabove for the prior art.

It will be appreciated that the values provided in the embodiment provided above are exemplary only. Polysilicon spacer word lines 330 may have a width of 0.1 F-0.5 F. Similarly, width spaces 335 may be 1 F or smaller. The constraint may be that the pitch of the mask for word line retaining walls 390' may be 2 F. This may be split between wall width of 0.8 F and width space of 1.2 F or some other arrangement.

In an alternative embodiment of the present invention, array 400 may not have anti punchthrough implants.

This alternative embodiment is also illustrated in FIG. 12. The steps for this embodiment may include steps 402-420 of the previous embodiment at which point, spacer word lines 330 may be created (as illustrated in FIGS. 16A and 16B) next to word line retaining walls 390'.

Figure 25A:
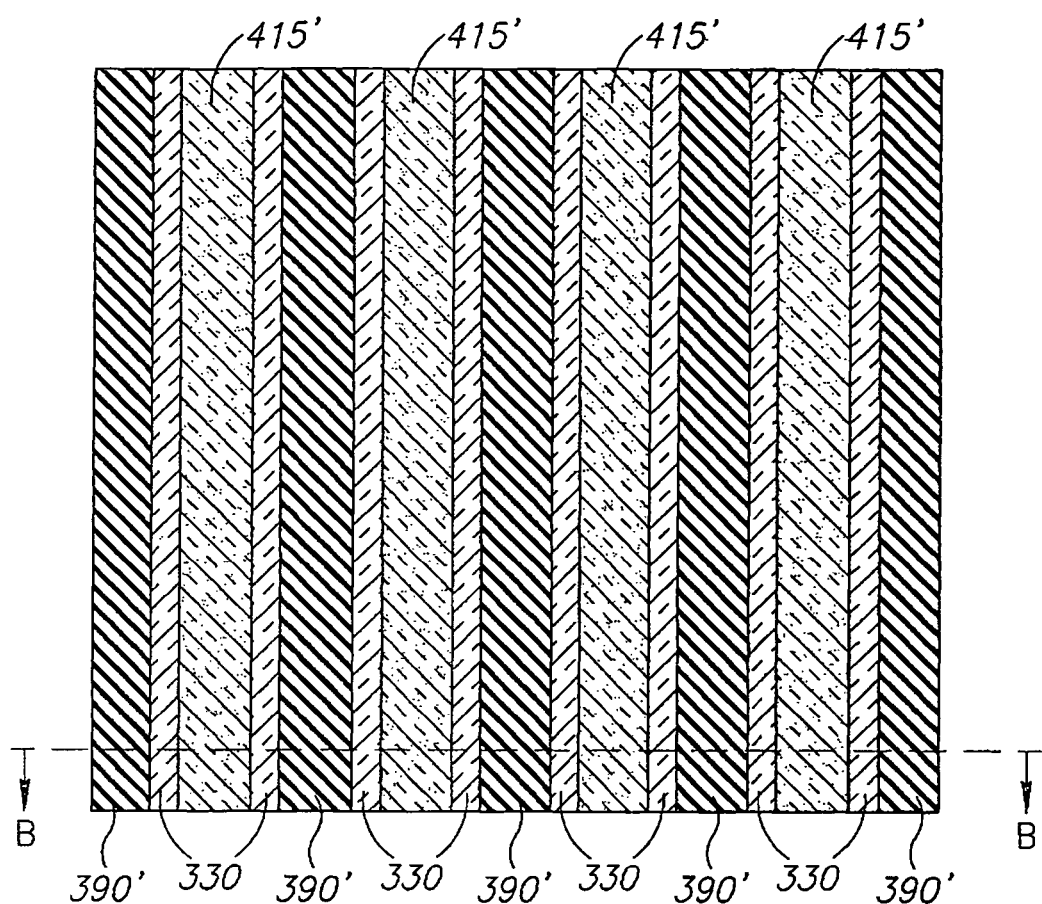
Figure 25B:
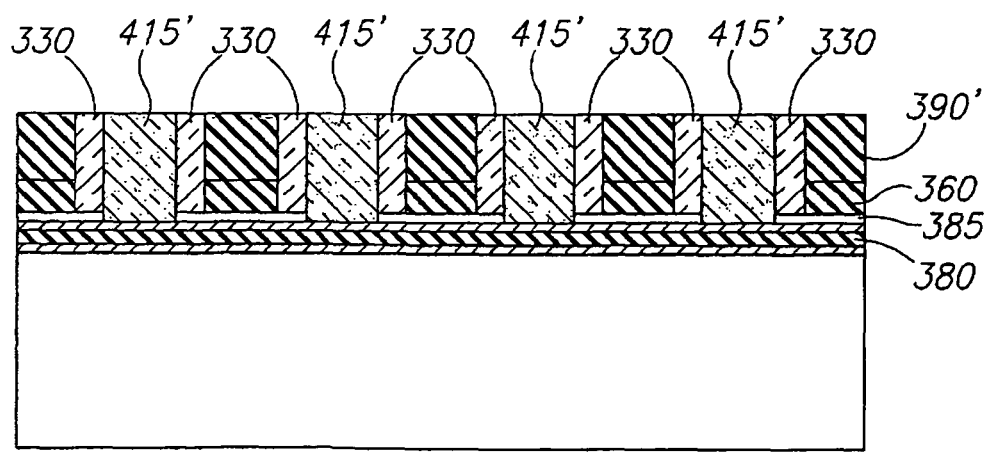

As APT implants are not required (as checked in step 422), the next step may be to deposit (step 440) oxide filler 415' between spacer word line 330. As in the previous embodiment, array 400 may also be planarized at this point to remove excess oxide filler. Reference is now made to FIGS. 25A and 25B which illustrate the results of step 440. Oxide filler 415' may be on top of ONO layer 380, and may fill the entire area between spacer word lines 330. It will be appreciated that the areas covered by oxide filler 415' may be equivalent to the areas that may be covered by oxide spacers 410 and oxide filler 415 in the previous embodiment.

Figure 26A:
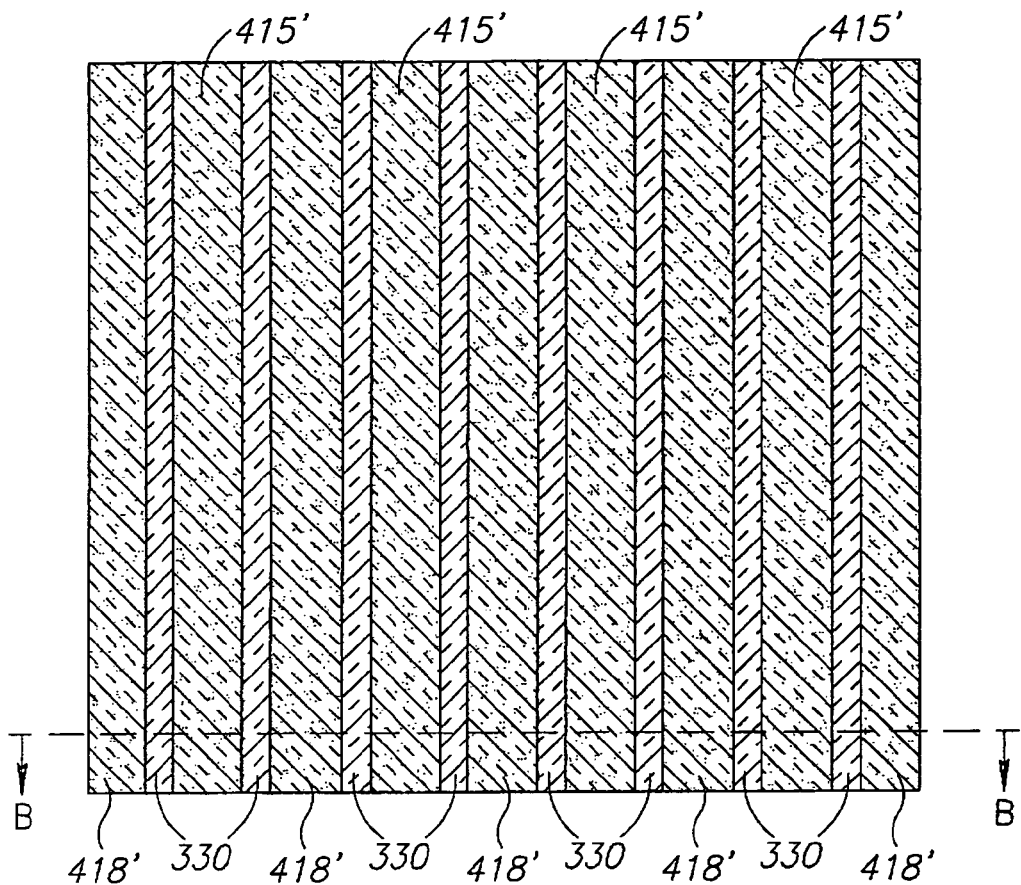
Figure 26B:
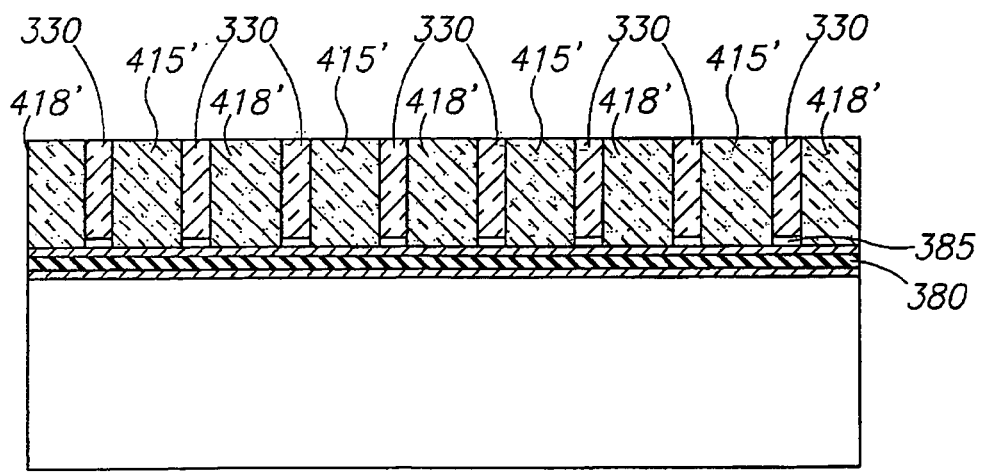

Step 450 may then proceed as in the previous embodiment to remove retaining walls 390'. As illustrated in FIGS. 26A and 26B, to which reference is now made, retaining walls 390' may be removed and ONO layer 380 exposed between spacer word lines 330.

Again assuming that APT implants are not required (as checked in step 452), the next step may be to deposit (step 470) oxide filler 418' in the area previously filled by retaining walls 390'. As in the previous embodiment, array 400 may also be planarized at this point to remove excess oxide filler. FIGS. 26A and 26B illustrate the results of step 470. Oxide filler 415' may be on top of ONO layer 380, and may fill the entire area between spacer word lines 330. It will be appreciated that the areas covered by oxide filler 418' may be equivalent to the areas that may be covered by oxide spacers 411 and oxide filler 418 in the previous embodiment.

Processing may continue with word line salicidation (step 480) as in the previous embodiment. When comparing FIGS. 23A and 23B of the previous embodiment to FIGS. 26A and 26B of the present embodiment, it will be appreciated that other than the absence of APT implants and the etching of ONO 380 required to facilitate such implants, there may be no material differences between memory arrays 400 manufactured via the two embodiments. In both embodiments, there may be oxide fillers between spacer word lines 330. In the previous embodiment such fillers may be comprised of oxide spacers 410 and 411 as well as oxide fillers 415 and 418. In the present embodiment such fillers may be comprised of oxide fillers 415' and 418'.

It will thus be appreciated that there may be no material difference between the sizes of memory cells 38 (FIG. 11) manufactured via the two embodiments. Other than the absence of APT implants and the existence of more elements of ONO 380, the results of the present embodiment may be generally similar to those of the previous embodiment.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A non-volatile memory array comprising:
   word lines of a sub-F width (sub-minimum feature size F);
   said word lines spaced a sub-F width apart;
   bit lines generally perpendicular to said word lines; and
   wherein said sub-F word line width is at least 0.5 F and said sub-F spacing is less than 0.5 F.

2. The array according to claim 1 and wherein said array is a NROM (nitride read only memory) array.

3. The array according to claim 1 and wherein said sub-F spacing is filled with dielectric.

4. The array according to claim 3 and wherein said dielectric is oxide-nitride-oxide.

5. A non-volatile memory array comprising:
   word lines of a sub-F width (sub-minimum feature size F);
   said word lines are spaced a sub-F width apart;
   bit lines generally perpendicular to said word lines; and
   wherein said sub-F word line width is at least 0.1 F and said sub-F spacing is at least 0.7 F.

6. The array according to claim 5 and wherein said word lines are formed from polysilicon spacers.

* * * * *